United States Patent
Ikuma et al.

(10) Patent No.: US 10,847,556 B2
(45) Date of Patent: Nov. 24, 2020

(54) SOLID-STATE IMAGING APPARATUS AND IMAGING APPARATUS

(71) Applicant: PANASONIC INTELLECTUAL PROPERTY MANAGEMENT CO., LTD., Osaka (JP)

(72) Inventors: Makoto Ikuma, Kyoto (JP); Hiroyuki Amikawa, Kyoto (JP); Takayasu Kito, Osaka (JP); Shinichi Ogita, Kyoto (JP); Junichi Matsuo, Osaka (JP); Yasuyuki Endoh, Hyogo (JP); Katsumi Tokuyama, Osaka (JP); Tetsuya Abe, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/431,277

(22) Filed: Jun. 4, 2019

(65) Prior Publication Data
US 2019/0288020 A1    Sep. 19, 2019

Related U.S. Application Data

(63) Continuation of application No. PCT/JP2017/042988, filed on Nov. 30, 2017.
(Continued)

(51) Int. Cl.
*H01L 27/146* (2006.01)
*H01L 27/142* (2014.01)
(Continued)

(52) U.S. Cl.
CPC ...... *H01L 27/14605* (2013.01); *H01L 27/142* (2013.01); *H04N 5/2253* (2013.01);
(Continued)

(58) Field of Classification Search
CPC ............. H01L 27/142; H01L 27/147; H01L 27/14605; H01L 27/146; H04N 5/235;
(Continued)

(56) References Cited

U.S. PATENT DOCUMENTS

| | | |
|---|---|---|
| 8,823,850 B2 | 9/2014 | Rysinski et al. |
| 2004/0223065 A1 | 11/2004 | Takayanagi |

(Continued)

FOREIGN PATENT DOCUMENTS

| | | |
|---|---|---|
| EP | 0757476 A2 | 2/1997 |
| EP | 1 819 151 A1 | 8/2007 |
| JP | 2007-266556 A | 10/2007 |

OTHER PUBLICATIONS

Extended European Search Report dated Dec. 2, 2019 issued in corresponding European Patent Application No. 17878149.8.
(Continued)

*Primary Examiner* — Chuong A Luu
(74) *Attorney, Agent, or Firm* — McDermott Will & Emery LLP

(57) ABSTRACT

A solid-state imaging apparatus includes a plurality of high-sensitivity pixels that are arranged in a matrix, and perform a photoelectric conversion at a predetermined sensitivity; a plurality of low-sensitivity pixels that are arranged in a matrix in gaps between the plurality of high-sensitivity pixels, and perform a photoelectric conversion at a lower sensitivity than the predetermined sensitivity; and a signal processor that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal.

14 Claims, 26 Drawing Sheets

Related U.S. Application Data

(60) Provisional application No. 62/431,603, filed on Dec. 8, 2016.

(51) Int. Cl.

| | | |
|---|---|---|
| *H04N 5/225* | (2006.01) | |
| *H04N 5/232* | (2006.01) | |
| *H04N 5/235* | (2006.01) | |
| *H04N 5/363* | (2011.01) | |
| *H04N 5/378* | (2011.01) | |
| *H04N 17/00* | (2006.01) | |
| *H04N 5/355* | (2011.01) | |
| *H04N 5/353* | (2011.01) | |
| *B60R 11/04* | (2006.01) | |
| *B60R 11/00* | (2006.01) | |

(52) U.S. Cl.
CPC ......... *H04N 5/2254* (2013.01); *H04N 5/2353* (2013.01); *H04N 5/23229* (2013.01); *H04N 5/353* (2013.01); *H04N 5/355* (2013.01); *H04N 5/3559* (2013.01); *H04N 5/35554* (2013.01); *H04N 5/35563* (2013.01); *H04N 5/363* (2013.01); *H04N 5/378* (2013.01); *H04N 17/002* (2013.01); *B60R 11/04* (2013.01); *B60R 2011/0033* (2013.01)

(58) Field of Classification Search
CPC ...... H04N 5/232; H04N 5/225; H04N 5/2254; H04N 5/23229; H04N 5/2353; H04N 5/2253; H04N 5/353; H04N 5/355; H04N 5/35554; H04N 5/35563; H04N 5/3559; H04N 5/363; H04N 5/378; H04N 5/376; H04N 5/3745; H04N 5/3765; H04N 5/37455; H04N 5/335; H04N 17/00; H04N 17/002
USPC ........................................................ 257/432
See application file for complete search history.

(56) References Cited

U.S. PATENT DOCUMENTS

| | | |
|---|---|---|
| 2007/0080838 A1 | 4/2007 | Asayama et al. |
| 2010/0245647 A1 | 9/2010 | Honda et al. |
| 2016/0173796 A1 | 6/2016 | Takado |
| 2016/0255289 A1 | 9/2016 | Johnson et al. |
| 2017/0104942 A1* | 4/2017 | Hirota ................ H04N 5/35563 |
| 2017/0155858 A1* | 6/2017 | Mabuchi ........... H01L 27/14621 |
| 2019/0289238 A1 | 9/2019 | Ikuma et al. |

OTHER PUBLICATIONS

Partial Supplementary European Search Report dated Sep. 19, 2019 issued in corresponding European Patent Application No. 17878149.8.

International Search Report and Written Opinion dated Feb. 20, 2018 in International Application No. PCT/JP2017/042988; with partial English translation.

International Search Report and Written Opinion dated Jan. 23, 2018 in International Application No. PCT/JP2017/042989; with partial English translation.

Notice of Allowance issued in U.S. Appl. No. 16/431,302, dated Mar. 20, 2020.

* cited by examiner

SOLID-STATE IMAGING APPARATUS AND IMAGING APPARATUS

CROSS REFERENCE TO RELATED APPLICATIONS

This application is a U.S. continuation application of PCT International Patent Application Number PCT/JP2017/042988 filed on Nov. 30, 2017, claiming the benefit of priority of U.S. Provisional Patent Application No. 62/431,603 filed on Dec. 8, 2016, the entire contents of which are hereby incorporated by reference.

BACKGROUND

1. Technical Field

The present disclosure relates to a solid-state imaging apparatus and an imaging apparatus.

2. Description of the Related Art

For conventional solid-state imaging apparatuses, a solid-state imaging apparatus as shown in, for example, Japanese Unexamined Patent Application Publication No. 2007-266556 has been proposed for increasing dynamic range. The solid-state imaging apparatus in Japanese Unexamined Patent Application Publication No. 2007-266556 includes high-sensitivity pixels and low-sensitivity pixels that are lower in sensitivity than the high-sensitivity pixels, and in, for example, paragraph 0059, "attaining a broad dynamic range from both the low sensitivity and high sensitivity by forming deep charge storage regions at the high-sensitivity pixels and shallow charge storage regions at the low-sensitivity pixels" has been proposed.

According to Japanese Unexamined Patent Application Publication No. 2007-266556, however, balancing dynamic range expansion and flicker reduction poses a problem.

Flicker reduction will be described first. In recent years, light-emitting diode (LED) light sources and laser diode (LD) light sources have become widespread. These light sources often use dynamic lighting in which LEDs are repeatedly turned on and off at a speed unperceivable by the human eye. In other words, flicker occurs at a speed unperceivable by the human eye. For example, LED light sources are used for, aside from luminaires, traffic lights, headlights and brake lights in vehicles, and the like. With dynamic lighting, light sources appear as static lighting to the human eye, but flicker causes interference when capturing these using a solid-state imaging apparatus. When a solid-state imaging apparatus captures such light sources or illumination environments using such light sources, there are cases where an image is obtained in which the light sources are on (or a bright image is obtained) and cases where an image is obtained in which the light sources are off (or a dark image is obtained). In other words, flicker occurs in the captured image itself. The latter, i.e., cases where an image is obtained in which the light sources are off (or a dark image is obtained) can be referred to as imaging faults. Hereinafter, controlling imaging faults that are the cause of such flicker is referred to as flicker reduction.

In Japanese Unexamined Patent Application Publication No. 2007-266556, high-sensitivity pixels and a long exposure time are used during low illuminance, and low-sensitivity pixels and a short exposure time are used during high illuminance in order to increase dynamic range.

Accordingly, flicker reduction is difficult since the exposure time during high illuminance is short. On the other hand, flicker reduction is possible by making the exposure time longer, but dynamic range will decrease due to pixel saturation.

However, flicker reduction can be anticipated since the exposure time during low illuminance is long, but dynamic range is low due to pixel saturation. On the other hand, the problem of dynamic range becoming low can be limited by making the exposure time shorter, but flicker reduction cannot be anticipated.

The present disclosure, which takes the above problem into account, provides a solid-state imaging apparatus and an imaging apparatus that balance flicker reduction and an increase in dynamic range.

SUMMARY

In order to solve the above problem, a solid-state imaging apparatus in the present disclosure includes a plurality of high-sensitivity pixels that are arranged in a matrix, and perform a photoelectric conversion at a predetermined sensitivity; a plurality of low-sensitivity pixels that are arranged in a matrix in gaps between the plurality of high-sensitivity pixels, and perform a photoelectric conversion at a lower sensitivity than the predetermined sensitivity; and a signal processor that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal.

The solid-state imaging apparatus and the imaging apparatus in the present disclosure can balance flicker reduction and an increase in dynamic range.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Circumstances Leading Up to Present Disclosure

The problem stated in the description of the related art will first be described with reference to FIG. 4.

Figure 4:
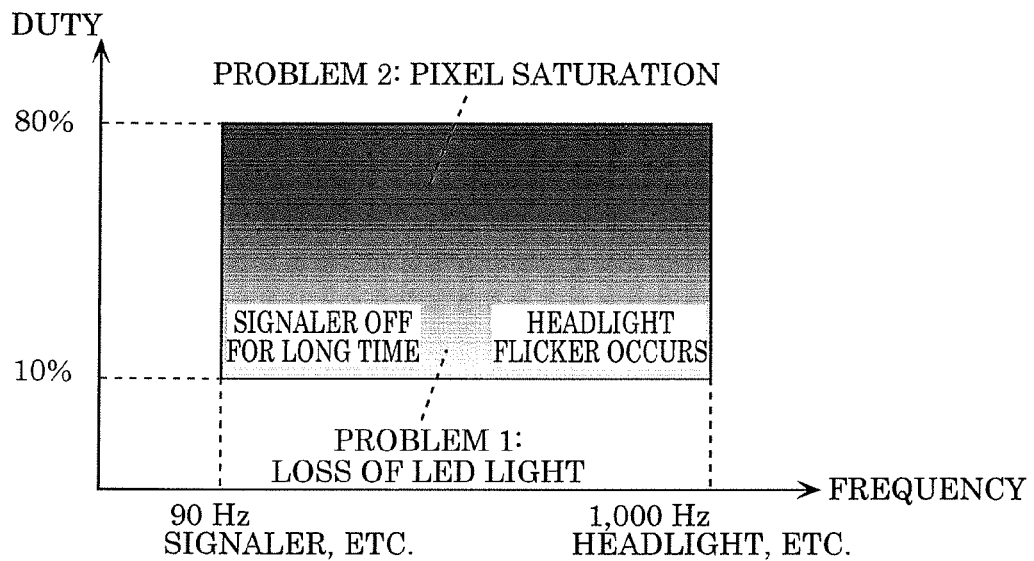
FIG. 4 is an explanatory diagram of light-emitting diode (LED) flicker.

FIG. 4 is an explanatory diagram of LED flicker. The horizontal axis in the drawing indicates flicker frequency, i.e., a frequency of one cycle in which an LED is on and off. The vertical axis indicates flicker duty, i.e. the proportion of the LED being on in one cycle. For example, a flicker frequency of a street light is approximately 90 Hz, and a flicker frequency of car headlights is approximately 1000 Hz.

Generally, as in Japanese Unexamined Patent Application Publication No. 2007-266556, pixels with a different sensitivity are disposed and a correct image is output by processing an output signal of these pixels in order to reduce LED flicker.

Here, the first problem is loss of LED light (light emitted by an LED being repeatedly on and off, pulsed light) (problem 1). The cause for this is an incongruity between exposure timing and LED lighting timing due to using rolling shutter, especially when the exposure time is short during in bright areas (cause 1). This can be solved by making the exposure time of low-sensitivity pixels with a high saturation-sensitivity ratio longer (for example, one vertical scanning period) (solution 1).

The second problem is pixel saturation (problem 2). The cause for this is that the pixels become saturated and a white balance is lost when the LED flicker duty is too high or when the exposure time is too long (cause 2). With regard to this, pixels with different saturation-sensitivity ratios are disposed, pixel saturation is made to occur less easily, and the dynamic range of the low-sensitivity pixels is increased (solution 2).

In other words, the low-sensitivity pixels that capture LED light may be disposed as pixels with static exposure (solution 1) and different saturation-sensitivity ratios (solution 2) with regard to the above problems 1 and 2.

The exposure time and gain parameters of the low-sensitivity pixels that capture this discontinuous LED light may be configured separately from the exposure time and gain parameters of the high-sensitivity pixels that capture continuous LED light.

This makes it possible to completely separately configure parameters of the flicker reduction and WDR functionality or balance these settings when capturing transportation machinery (to give an example, a vehicle) using the solid-state imaging apparatus.

In this manner, it is possible to balance dynamic range expansion and flicker reduction since the solid-state imaging apparatus includes high-sensitivity pixels and low-sensitivity pixels having different sensitivities, the high-sensitivity pixels are exposed in parallel with the low-sensitivity pixels, an exposure time of the low-sensitivity pixels is longer than an exposure time of the high-sensitivity pixels, and one pixel signal is generated by correcting the signal from the high-sensitivity pixels with the signal from the low-sensitivity pixels. As for the specifications of these low-sensitivity pixels, a photogate structure may be used for increasing the saturation level, a neutral-density (ND) filter (gray filter) may be used for decreasing the sensitivity, and the saturation-sensitivity ratio may also be increased.

According to this method, during low illuminance for example, the solid-state imaging apparatus increases a gain inside the pixels by using high-sensitivity pixels and make sure that a voltage (pixel signal) does not increase depending on an amount of light received with respect to noise produced by a pixel amplification transistor or analog circuit. In other words, it is possible to output a high-quality image with a high signal-to-noise ratio (S/N) with respect to dark subjects.

During high illuminance, however, it is possible to increase the dynamic range and have a long exposure time by using low-sensitivity pixels with a high saturation-sensitivity ratio and lowering the gain inside the pixels. In other words, it is possible to output an image accurately reproducing gradients of a subject without blown out highlights and further reducing flicker with respect to bright subjects.

Accordingly, the inventors have conceived a solid-state imaging apparatus that balances image quality improvement during low illuminance, dynamic range expansion during high illuminance, and flicker reduction by using low-sensitivity pixels with a high saturation-sensitivity ratio as the technique for increasing dynamic range and reducing flicker.

Hereinafter, the solid-state imaging apparatus according to embodiments in the present disclosure will be described with reference to the drawings.

However, unnecessarily detailed descriptions may be omitted.

For example, detailed descriptions of well-known matters or descriptions of components that are substantially the same as components described previous thereto may be omitted. This is to avoid redundancy and facilitate understanding of the descriptions for those skilled in the art. Note that the accompanying drawings and subsequent descriptions are provided to facilitate sufficient understanding of the present disclosure by those skilled in the art, and are thus not intended to limit the scope of the subject matter recited in the claims. In other words, the subsequent embodiments show a specific example in the present disclosure, and numerical values, shapes, components, placement and connection of the components, order of processes, and the like are mere examples and are not intended to limit the present disclosure.

Embodiment 1

A configuration example of a solid-state imaging apparatus according to Embodiment 1 will first be described. Configuration Example of Solid-State Imaging Apparatus 1

Figure 1:
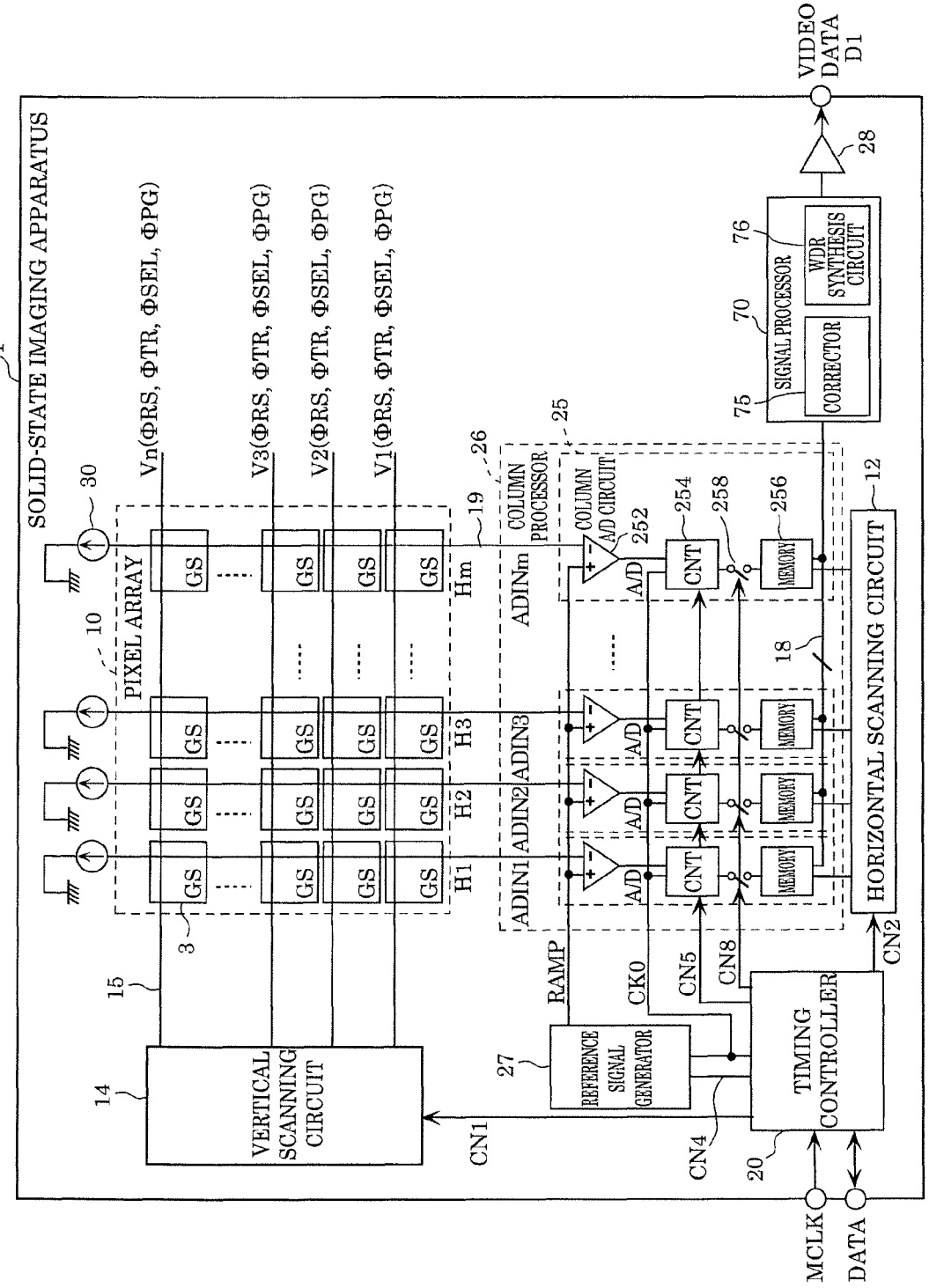
FIG. 1 is a block diagram showing a configuration example of a solid-state imaging apparatus according to Embodiment 1.

FIG. 1 is a block diagram showing the configuration example of solid-state imaging apparatus 1 according to the present embodiment.

Solid-state imaging apparatus 1 shown in the drawing includes pixel array 10, horizontal scanning circuit 12, vertical scanning circuit 14, vertical signal lines 19, timing controller 20, column processor 26, reference signal generator 27, output circuit 28, and signal processor 70. Solid-state imaging apparatus 1 further includes a master clock (MCLK) terminal that exteriorly receives a master clock input signal, a DATA terminal for exteriorly transceiving a command or data, a D1 terminal for exteriorly transmitting video data, and the like, and also includes various types of terminals to which a power-supply voltage and a ground voltage are supplied.

Pixel array 10 includes pixel circuits 3 arranged in a matrix. Pixel circuits 3 are arranged in n rows and m columns in FIG. 1. Pixel circuits 3 each include at least one high-sensitivity pixel and one low-sensitivity pixel. In other words, pixel circuits 3 each include at least one of high-sensitivity pixel that performs a photoelectric conversion at a predetermined sensitivity, and at one low-sensitivity pixel that performs the photoelectric conversion at a sensitivity low than the predetermined sensitivity.

Horizontal scanning circuit 12 outputs an analog-to-digitally (A/D) converted pixel signal to horizontal signal lines 18 by scanning memory 256 in each of column A/D circuits 25 one by one. This scanning may be performed in the same order as column A/D circuits 25 are arranged.

Vertical scanning circuit 14 scans horizontal scan line group (also referred to as row control line group) 15 disposed per row of pixel circuits 3 in pixel array 10 in row units. With this, vertical scanning circuit 14 selects pixel circuits 3 per row unit and causes the pixel signal from pixel circuits 3 belonging to the selected row to be simultaneously output to m vertical signal lines 19. The same number of horizontal scan line groups 15 are disposed as there are rows of pixel circuits 3. In FIG. 1, n horizontal scan line groups 15 are disposed (in FIG. 1, V1, V2, . . . , Vn). Each horizontal scan line group 15 includes reset control line ΦRS, readout control lines ΦR1 and ΦTR2, gain control line ΦGC, and selection control line ΦSEL.

Vertical signal line 19 is disposed per column of pixel circuits 3 in pixel array 10 and propagates the pixel signal from pixel circuits 3 belonging to the selected row to column A/D circuits 25. Vertical signal lines 19 include m vertical signal lines H1 to Hm. Analog-to-digital converter (ADC) input lines include m ADC input lines ADIN1 to ADINm.

Timing controller 20 controls the entirety of solid-state imaging apparatus 1 by generating various control signal groups. The various control signal groups include control signal groups CN1, CN2, CN4, CN5, CN8, and counter clock signal CK0. For example, timing controller 20 receives master clock MCLK via a terminal; generates various internal clocks; and controls horizontal scanning circuit 12, vertical scanning circuit 14, and the like.

Column processor 26 includes column A/D circuit 25 per column. Column A/D circuits 25 each A/D convert the pixel signal from vertical signal lines 19.

Column A/D circuits 25 each include voltage comparator 252, counter 254, and memory 256.

Voltage comparator 252 (i) compares the analog pixel signal from vertical signal lines 19 with reference signal RAMP that is generated by reference signal generator 27 and includes a ramp waveform (i.e., triangular wave), and, for example, (ii) inverts the output signal indicating the comparison result when the former is greater than the latter.

Counter 254 counts the time from when the triangular waves in reference signal RAMP start to change to when the output signal of voltage comparator 252 is inverted. Since the time up to the inverting is determined in accordance with the value of the analog pixel signal, a count value is digitalized pixel signal.

Memory 256 retains the count value of counter 254, i.e., the digital pixel signal.

Reference signal generator 27 generates reference signal RAMP including triangular waves, and outputs reference signal RAMP to a plus input terminal of voltage comparator 252 in each of column A/D circuits 25.

Output circuit 28 outputs the digital pixel signal to video data terminal D1.

Signal processor 70 includes corrector 75 and WDR synthesis circuit 76, and generates a pixel signal by (i) detecting a difference signal between a signal from the high-sensitivity pixels and a signal from the low-sensitivity pixels, and (ii) correcting the signal from the high-sensitivity pixels using the difference signal. This enables signal processor 70 to balance dynamic range expansion and flicker reduction.

Configuration Example of Pixel Circuit 3

A configuration example of pixel circuit 3 will be described next.

Figure 2:
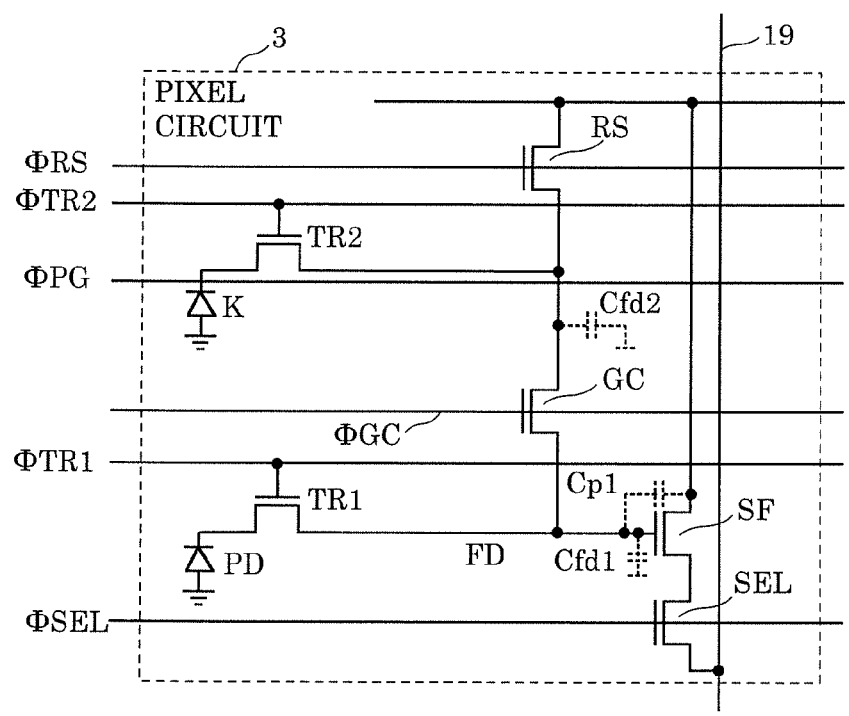
FIG. 2 is a diagram showing a circuitry example of a pixel circuit according to Embodiment 1.

FIG. 2 is a circuitry example of pixel circuit 3 according to Embodiment 1. Pixel circuit 3 in the drawing includes one high-sensitivity pixel PD and one low-sensitivity pixel K, floating diffusion layer FD, first transfer transistor TR1, second transfer transistor TR2, reset transistor RS, gain control transistor GC, amplification transistor SF, and selection transistor SEL.

High-sensitivity pixel PD is a photoelectric conversion element, e.g. a photodiode, and performs the photoelectric conversion at the predetermined sensitivity, i.e., generates an electric charge depending on the amount of light received.

Low-sensitivity pixel K is a photoelectric conversion element, e.g. a photodiode, and performs the photoelectric conversion at a sensitivity lower than the predetermined sensitivity. For example, a light-receiving area of low-sensitivity pixel K is smaller than a light-receiving area of high-sensitivity pixel PD.

Low-sensitivity pixel K includes control electrode PG that covers a portion of low-sensitivity pixel K. Control electrode PG controls a potential of a surface of low-sensitivity pixel K in accordance with a voltage applied to control electrode PG (in the drawing, control voltage ΦPG). This enables control electrode PG to increase and decrease a saturation level of low-sensitivity pixel K.

Floating diffusion layer FD retains signal charge (e.g. an electron) forwarded from high-sensitivity pixel PD or low-sensitivity pixel K, converts the retained signal charge to a voltage, and supplies the converted voltage to a gate of amplification transistor SF. A substantive capacitance of floating diffusion layer FD does not only include a capacitance of floating diffusion layer FD itself, but also gate capacitance Cfd1 of amplification transistor SF, gate/drain capacitance Cp1 of amplification transistor SF, and stray capacitance Cfd2 of a drain wire of gain control transistor GC when gain control transistor GC is on.

First transfer transistor TR1 is a switch transistor that is turned on and off in accordance with readout control signal ΦTR1. First transfer transistor TR1 forwards (i.e., reads out) signal charge photoelectrically converted by high-sensitivity pixel PD to floating diffusion layer FD when readout control signal ΦTR1 is at a high level.

Second transfer transistor TR2 is a switch transistor that is turned on and off in accordance with readout control signal ΦTR2. Second transfer transistor TR2 forwards (i.e., reads out) signal charge photoelectrically converted by low-sensitivity pixel K to floating diffusion layer FD via gain control transistor GC when readout control signal ΦTR1 is at a high level.

Reset transistor RS is a switch transistor that is turned on and off in accordance with reset control signal ΦRS. Reset transistor RS sets floating diffusion layer FD to the power-supply voltage applied to the drain as a reset level via gain control transistor GC when reset control signal ΦRS is at a high level. In other words, reset transistor RS resets floating diffusion layer FD to the reset level when reset control signal ΦRS is at a high level.

Gain control transistor GC electrically disconnects or connects second transfer transistor TR2 and floating diffusion layer FD in accordance with gain control signal ΦGC. With this, a conversion gain that converts signal charge to a voltage in floating diffusion layer FD is changed. In other words, the conversion gain of floating diffusion layer FD increases upon turning off gain control transistor GC when the signal charge is being forwarded from high-sensitivity pixel PD to floating diffusion layer FD. The conversion gain of floating diffusion layer FD decreases upon turning on gain control transistor GC when the signal charge is being forwarded from low-sensitivity pixel K to floating diffusion layer FD.

Amplification transistor SF includes a source follower load that pairs current source 30 connected to vertical signal line 19 and amplification transistor SF, and outputs the voltage of the gate, i.e., the voltage of floating diffusion layer FD, to vertical signal line 19 as the analog pixel signal.

Selection transistor SEL is a switch transistor that is turned on and off in accordance with selection control signal ΦSEL. Selection transistor SEL electrically connects a source of amplification transistor SF and vertical signal line 19 when selection control signal ΦSEL is at a high level.

Note that pixel circuit 3 shown in FIG. 2 is an example of a two pixels per cell structure. "Two pixels" here means that there are two pixels, high-sensitivity pixel PD and low-sensitivity pixel K, i.e., two photoelectric conversion elements, e.g. photo diodes. "Per cell" here corresponds to a circuit unit including floating diffusion layer FD, reset transistor RS, amplification transistor SF, and selection transistor SEL, the "two pixels" sharing each of these.

Readout Operation Example Using Correlated Double Sampling

An operation in which the reset level and signal level of the analog pixel signal are read out and measured using correlated double sampling (CDS) will be described next.

Figure 3:
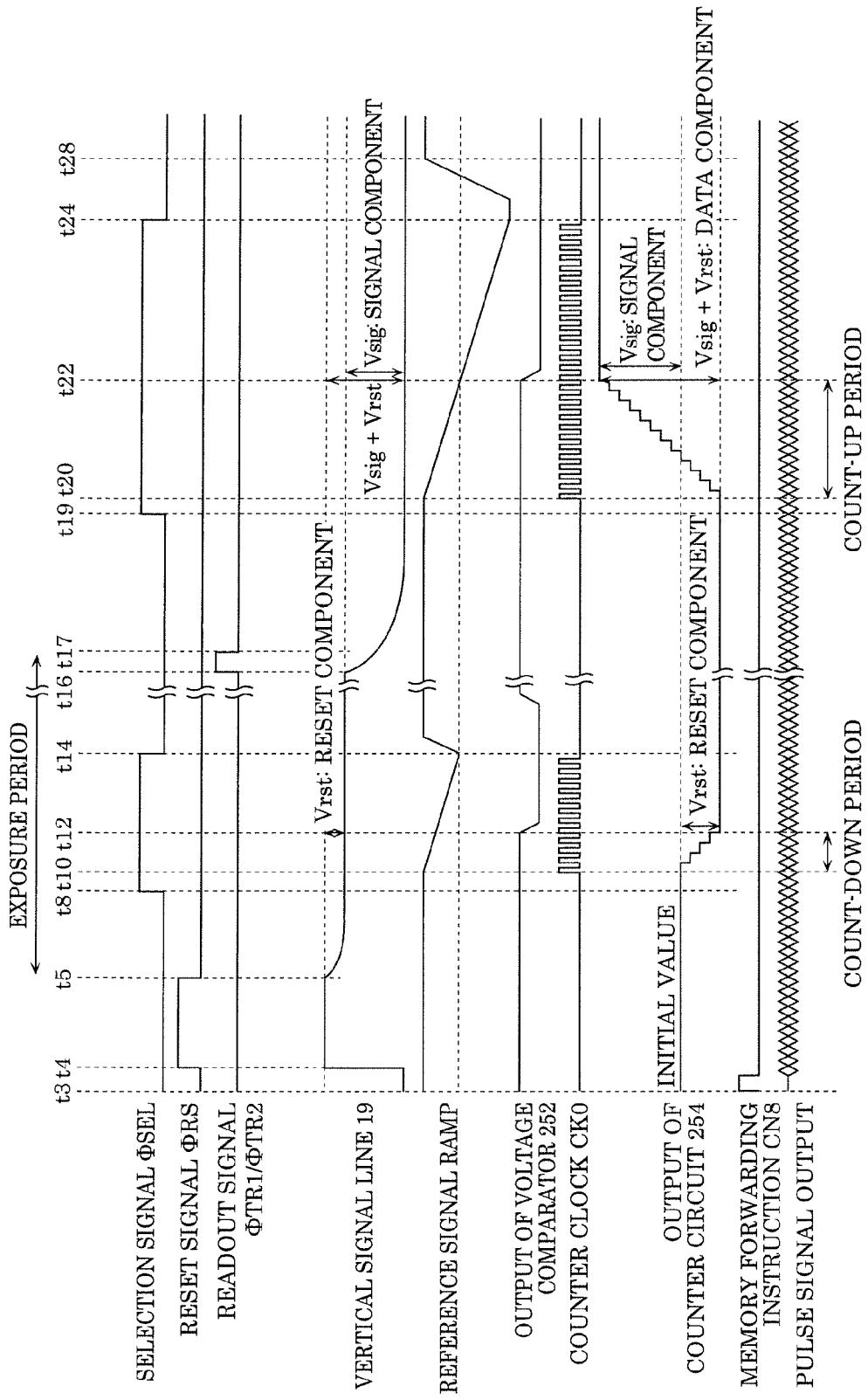
FIG. 3 is a timing diagram showing an operation example of a pixel readout according to Embodiment 1.

FIG. 3 is a timing diagram showing a signal readout operation example with one exposure operation of solid-state imaging apparatus 1 according to Embodiment 1. Solid-state imaging apparatus 1 performs, within one vertical scanning period, the exposure operation multiple times, each having a different exposure time, on the high-sensitivity pixels Solid-state imaging apparatus 1 performs, within one vertical scanning period, the exposure operation multiple times, each having a different exposure time, on the low-sensitivity pixels Reference signal RAMP has triangular waves at a count-down period (t10 to t14) and a count-up period (t20 to t24) in FIG. 3.

The count-down period is a period for A/D converting reset component Vrst of the analog pixel signal output from amplification transistor SF. The time from when the count-down period starts (when the triangular wave starts changing) up to when the output of voltage comparator 252 is inverted is counted down by counter 254. This count value is an A/D conversion result of reset component Vrst of the analog pixel signal.

The count-up period is a period for A/D converting a level of a data component (signal component Vsig+reset component Vrst) of the analog pixel signal output from amplification transistor SF. The time from when the count-up period starts (when the triangular wave starts changing) up to when the output of voltage comparator 252 is inverted is counted up by counter 254. This count-up converts the data component (Vsig+Vrst) of the analog pixel signal to a digital value. Since this count-up sets a count-down value indicating reset component Vrst as an initial value, a count value when the count-up period has finished represents a result of the CDS which subtracts the reset component from the data component. In other words, the count value when the count-up period has finished is a digital value representing signal component Vsig. In this manner, column A/D circuits 25 eliminate any variations in each of the columns, e.g. clock skew or counter delay, leading to measurement errors, and extract only the proper signal component Vsig, i.e., perform a digital CDS.

Readout Operation with Gain Control

Figure 5:
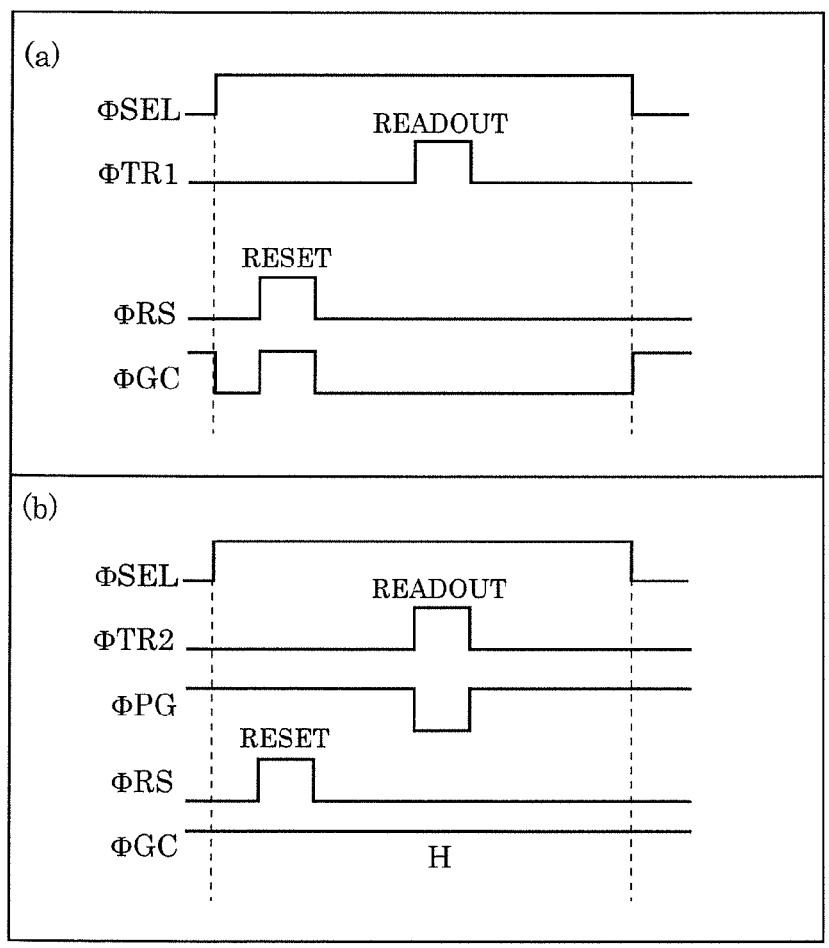
FIG. 5 is a timing diagram showing operation examples of pixel readouts with gain control according to Embodiment 1.

FIG. 5 is a timing diagram showing operation examples of pixel readouts with gain control according to Embodiment 1. Gain that converts the signal charge in floating diffusion layer FD to a voltage can be switched between high gain and low gain in accordance with gain control transistor GC being turned on and off. Image (a) of FIG. 5 shows the readout operation of the signal charge from high-sensitivity pixel PD to floating diffusion layer FD having a high conversion gain. Image (b) of FIG. 5 shows the readout operation of the signal charge from low-sensitivity pixel K to floating diffusion layer FD having a low conversion gain.

In image (a) of FIG. 5, floating diffusion layer FD is reset with a positive pulse of reset control signal (RS, and the signal charge is forwarded from high-sensitivity pixel PD with a positive pulse of readout control signal ΦTR1. When readout control signal ΦTR1 is at a high level, gain control signal (GC is at a low level and gain control transistor GC is turned off. In other words, the capacitance of floating diffusion layer FD mainly becomes Cfd1 and an FD conversion gain increases.

In image (b) of FIG. 5, floating diffusion layer FD is reset with a positive pulse of reset control signal (RS, and the signal charge is forwarded from low-sensitivity pixel K with a positive pulse of readout control signal ΦTR2. When readout control signal ΦTR2 is at a high level, gain control signal (GC is at a high level and gain control transistor GC is turned on. In other words, the capacitance of floating diffusion layer FD mainly becomes Cfd1+Cfd2 and the FD conversion gain decreases.

In this manner, when gain control transistor GC is at a low level during the readout, the conversion gain of floating diffusion layer FD increases due to gain control signal (GC. On the other hand, when gain control transistor GC is at a high level during the readout, the conversion gain of floating diffusion layer FD decreases.

Low-sensitivity pixel K can make the signal charge amount, which is accumulable proximate to the surface of low-sensitivity pixel K by control voltage (PG, and the saturation level variable. As shown in image (b) of FIG. 5, during the exposure time, control voltage ΦPG is at a high level and more signal charge can be accumulated. During the readout, control voltage ΦPG is at a low level and the signal charge is emitted.

The saturation level and the sensitivity of low-sensitivity pixel K will be described next with reference to FIGS. 6A and 6B.

Figure 6A:
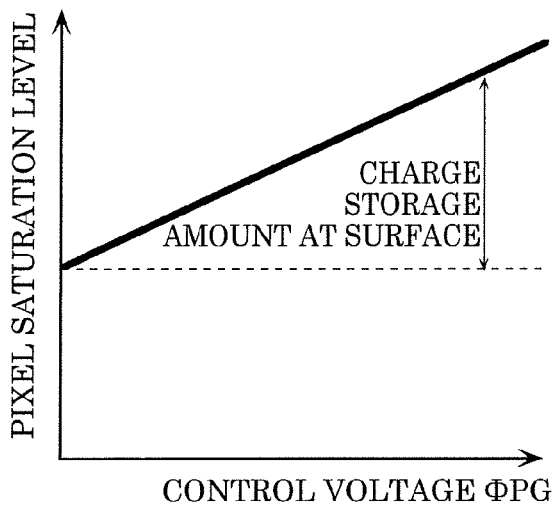
FIG. 6A is a diagram showing a control voltage and a pixel saturation level of the low-sensitivity pixel according to Embodiment 1.
Figure 6B:
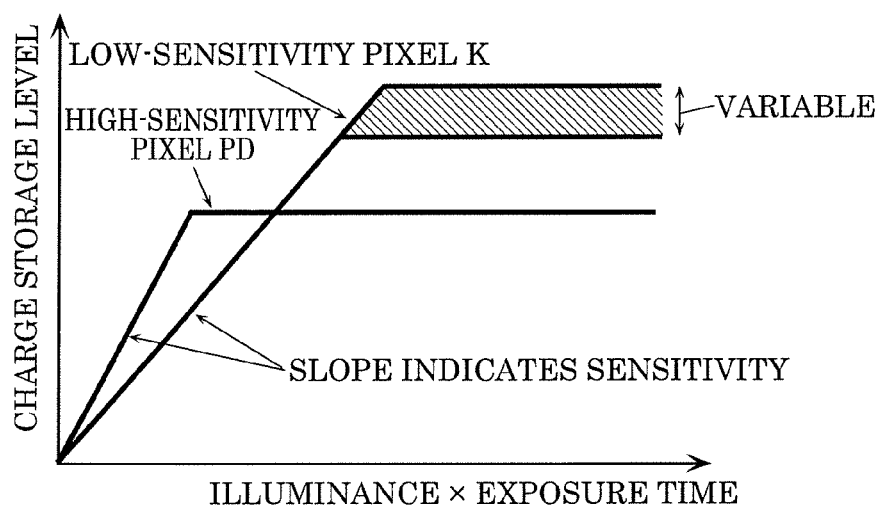
FIG. 6B is a diagram showing illuminance×exposure time and a charge storage level according to Embodiment 1.

FIG. 6A is a diagram showing control voltage ΦPG and the pixel saturation level of low-sensitivity pixel K according to Embodiment 1. The horizontal axis in the drawing indicates control voltage ΦPG and the vertical axis indicates the pixel saturation level. FIG. 6B is a diagram showing illuminance×exposure time and a charge storage level according to Embodiment 1. The horizontal axis in the drawing indicates the product of the illuminance and the exposure time, the illuminance at a fixed time, or the exposure time at a fixed illuminance. The vertical axis indicates the charge storage level.

The charge storage region of low-sensitivity pixel K includes (i) a deeply formed region similar to conventional photodiodes without control electrode PG and (ii) a new region formed proximate to a surface thereof by control electrode PG. When the voltage of control voltage ΦPG is low, an electric charge accumulates mainly in the deep region, and when the voltage of control voltage ΦPG increases, an electric charge accumulates in the shallow region proximate to the surface. In this manner, the saturation level of low-sensitivity pixel K is variable in accordance with the potential of control voltage ΦPG as shown in FIGS. 6A and 6B.

The sensitivity of low-sensitivity pixel K can be adjusted by laminating a ND filter, e.g. gray filter, to an (R, Gr, B, Gb) on-chip filter and adjusting a thickness and laminated region of this filter. An alternative method to the ND filter is performing a metal shielding and adjusting the area of an aperture area and sensitivity. The shutter and readout use a rolling motion. As shown in FIG. 6B, the saturation level of low-sensitivity pixel K is higher than that of high-sensitivity pixel PD, and the sensitivity of low-sensitivity pixel K is lower than that of high-sensitivity pixel PD.

Since it is possible to adjust the saturation level and the sensitivity level separately, the slope of the charge storage level and the saturation level can be set to a suitable value with respect to the illuminance and the exposure time. As a result, the saturation-sensitivity ratio can be adjusted and the dynamic range of the pixels can be freely adjusted.

Pixel Arrangement Example

A pixel arrangement of solid-state imaging apparatus 1 will be described next.

Figure 7:
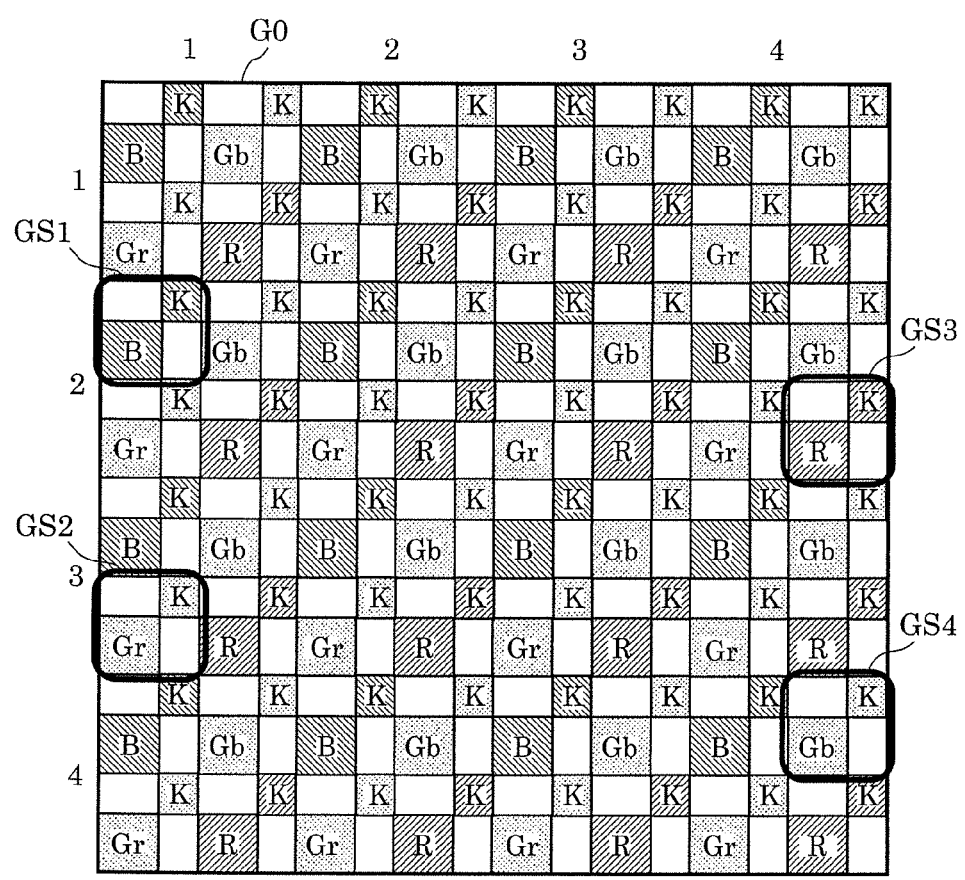
FIG. 7 is a diagram showing an arrangement example of high-sensitivity pixels and the low-sensitivity pixels according to Embodiment 1.

FIG. 7 is a diagram showing an arrangement example of the high-sensitivity pixels and the low-sensitivity pixels according to Embodiment 1. As illustrated in the drawing, solid-state imaging apparatus 1 includes pixels groups G0 arranged in a matrix. Pixel group G0 includes four high-sensitivity pixels PD arranged in a square region and four low-sensitivity pixels K arranged in the square region. R, Gr, B, and Gb in pixel group G0 in the drawing represent the four high-sensitivity pixels PD. The four Ks in pixel group G0 in the drawing represent the four low-sensitivity pixels K. From FIG. 7 onwards, in solid-state imaging apparatus 1 according to the present embodiment, one high-sensitivity pixel PD and one low-sensitivity pixel K form a pair.

The four high-sensitivity pixels PD (R, Gr, B, Gb in the drawing) and the four low-sensitivity pixels K corresponding thereto form a basic Bayer arrangement. The sensitivity can be decreased by laminating the gray filter to the (R, Gr, B, Gb) on-chip filter and causing the incident light to attenuate.

This makes it possible to make the saturation level of low-sensitivity pixel K higher than that of high-sensitivity pixel PD and the sensitivity of low-sensitivity pixel K lower than that of high-sensitivity pixel PD.

This makes it possible to increase the dynamic range of a light signal of the low-sensitivity pixel, and, for example, to receive a signal transmitted from a signaler with a comparatively low illuminance to a headlight with a high illuminance in the same frame with respect to a light-emitting source repeatedly turned on and off (pulsed light-emitting source, LED light source).

Note that the two pixels per cell pixel circuit 3 shown in FIG. 2 corresponds to GS1 to GS4 in FIG. 7.

Exposure Operation of High-Sensitivity Pixel PD and Low-Sensitivity Pixel K

An exposure operation of high-sensitivity pixel PD and low-sensitivity pixel K in solid-state imaging apparatus 1 will be described next.

Solid-state imaging apparatus 1 in the present embodiment generates, within one vertical scanning period, high-sensitivity frames by performing an exposure operation a plurality of times, each having a different exposure time, on high-sensitivity pixels PD, and low-sensitivity frames by performing an exposure operation a plurality of times, each having a different exposure time, on low-sensitivity pixels K. Signal processor 70 corrects a signal of each of the high-sensitivity frames using the signal from low-sensitivity pixels K, and synthesizes the corrected high-sensitivity frames.

Figure 8A:
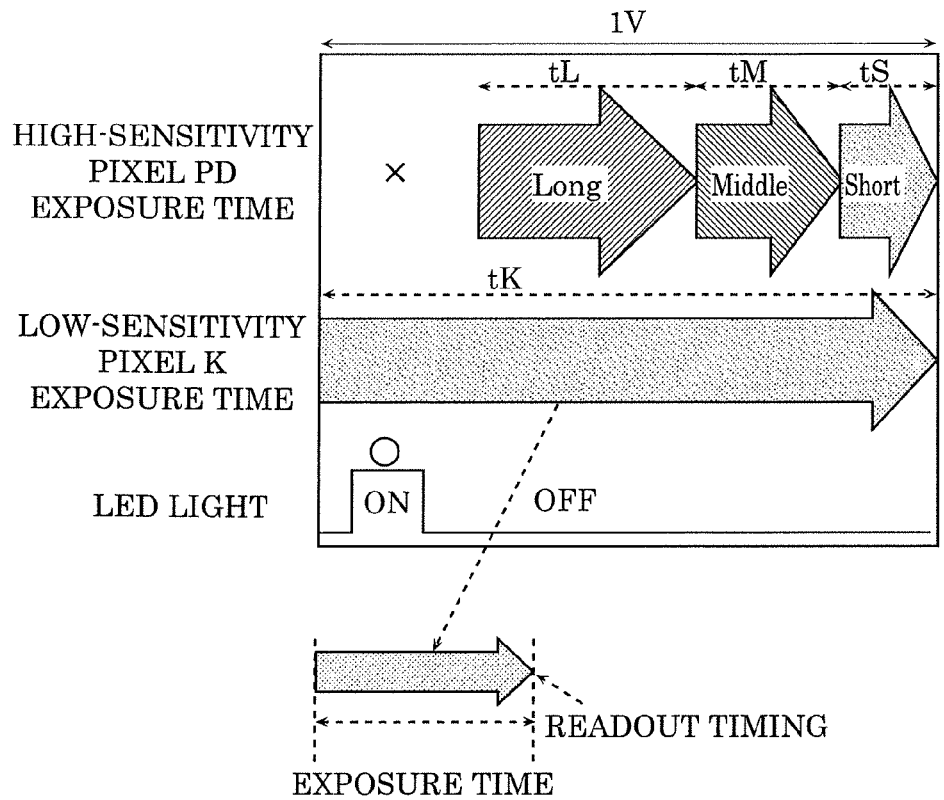
FIG. 8A is a diagram showing an example of an exposure operation of the high-sensitivity pixel and the low-sensitivity pixel according to Embodiment 1.
Figure 8B:
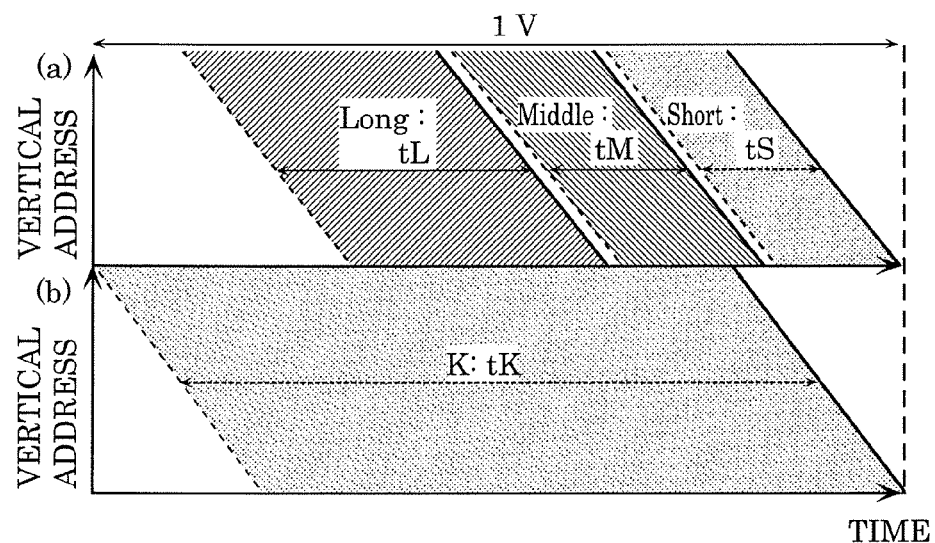
FIG. 8B is a diagram showing an example of an exposure operation and row scanning of the high-sensitivity pixel and the low-sensitivity pixel according to Embodiment 1.

FIG. 8A is a diagram showing an example of the exposure operation of the high-sensitivity pixel and the low-sensitivity pixel according to Embodiment 1. FIG. 8B is a diagram showing an example of an exposure operation and row scanning of the high-sensitivity pixel and the low-sensitivity pixel according to Embodiment 1.

Solid-state imaging apparatus 1, as illustrated in FIGS. 8A and 8B, generates, within vertical scanning period 1V, first high-sensitivity frame (L), second high-sensitivity frame (M), and third high-sensitivity frame (M) by respectively performing first exposure operation (Long) that exposes the high-sensitivity pixels for first exposure time (tL), second exposure operation (Middle) that exposes the high-sensitivity pixels for second exposure time (tM), and third exposure operation (Short) that exposes the high-sensitivity pixels for third exposure time (tS). Solid-state imaging apparatus 1, generates, within vertical scanning period 1V, low-sensitivity frame (K) by performing an exposure operation that exposes the low-sensitivity pixels for exposure time (tK) corresponding to one vertical scanning period. The readout operation shown in FIG. 3 is performed during the first exposure operation, the second exposure operation, the third exposure operation, and the exposure operation of low-sensitivity pixel K.

In this manner, solid-state imaging apparatus 1 according to the present embodiment exposes high-sensitivity pixel PD three times, exposure times tL, tM, and tS, which are split up with different durations, for increasing the dynamic range of high-sensitivity pixel PD. Low-sensitivity pixel K is exposed for the longer exposure time tK in parallel with high-sensitivity pixel PD.

The LED light in FIG. 8A cannot be exposed with exposure operations (Long, Middle, and Short) of high-sensitivity pixel PD (×mark), but can be exposed in low-sensitivity pixel K (O mark), and flicker reduction is possible upon correcting the signal of high-sensitivity pixel PD with the signal of low-sensitivity pixel K.

Note that FIG. 8B shows an output sequence of high-sensitivity pixel PD and low-sensitivity pixel K as the rolling shutter motion in the row scanning. The exposure time of high-sensitivity pixel PD and low-sensitivity pixel K can be freely configured.

By making exposure time tK of low-sensitivity pixel K roughly the same duration as one vertical scanning period, the lighting signal can reliably be captured with low-sensitivity pixel K when capturing a light-emitting source repeatedly and cyclically turned on and off (pulsed light-emitting source, LED light source).

With regard to the problem of the pixel saturation, external light changing within a range from low illuminance to high illuminance (pulsed light, LED light, LD light) can be captured in photodiode K of the low-sensitivity pixel having a high saturation-sensitivity ratio compared to high-sensitivity pixel PD. In other words, with regard to the lighting signal problem, light can be continuously received along the time axis, and with regard to the dynamic range problem, low-sensitivity pixel K can receive light more broadly.

Note that high saturation-sensitivity ratio means the following. Low-sensitivity pixel K has a higher saturation level and/or lower sensitivity than high-sensitivity pixel PD.

Configuration Example of Signal Processor 70

A configuration of signal processor 70 will be described next.

Figure 9A:
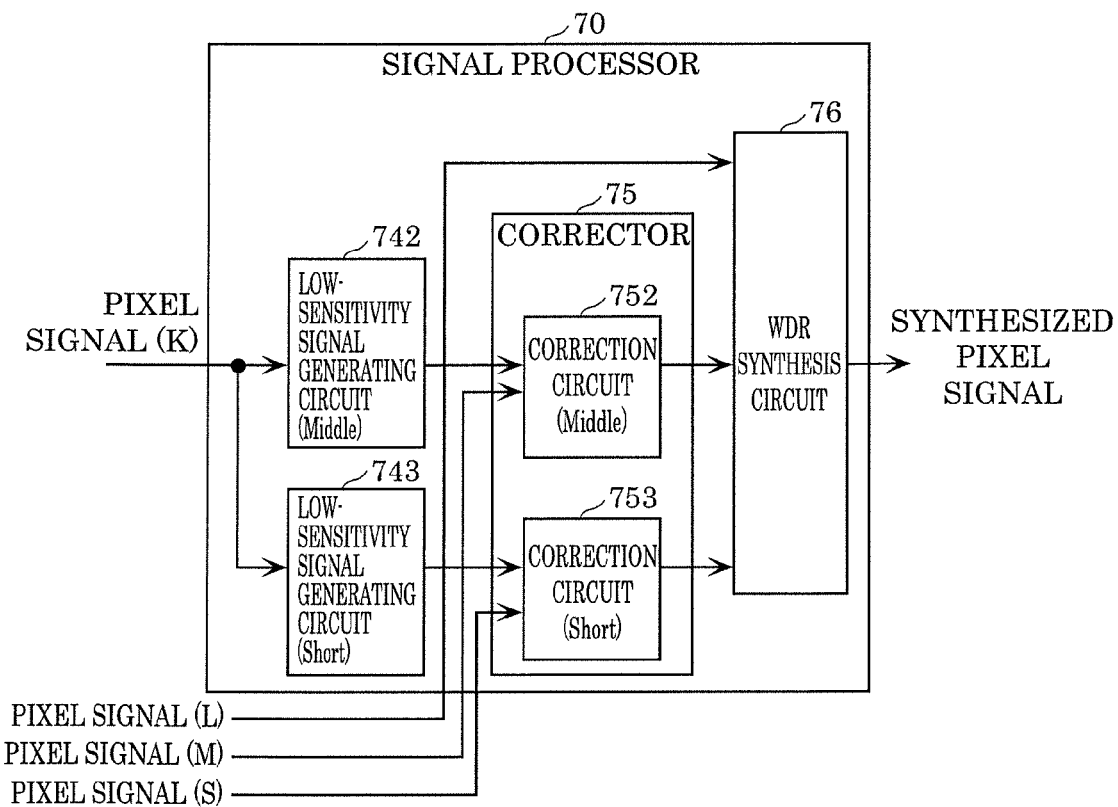
FIG. 9A is a diagram showing a configuration example of a signal processor according to Embodiment 1.
Figure 9B:
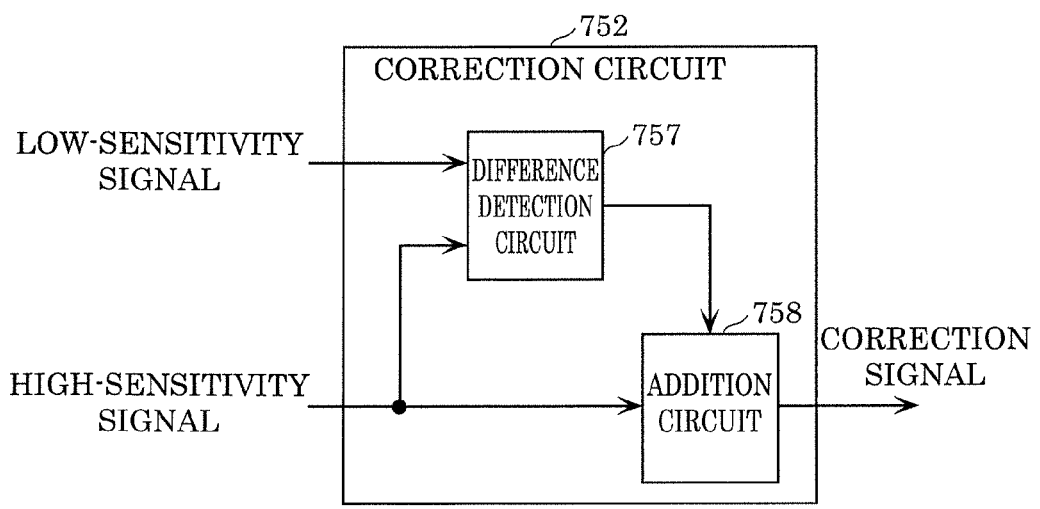
FIG. 9B is a configuration example of a correction circuit according to Embodiment 1.
Figure 9C:
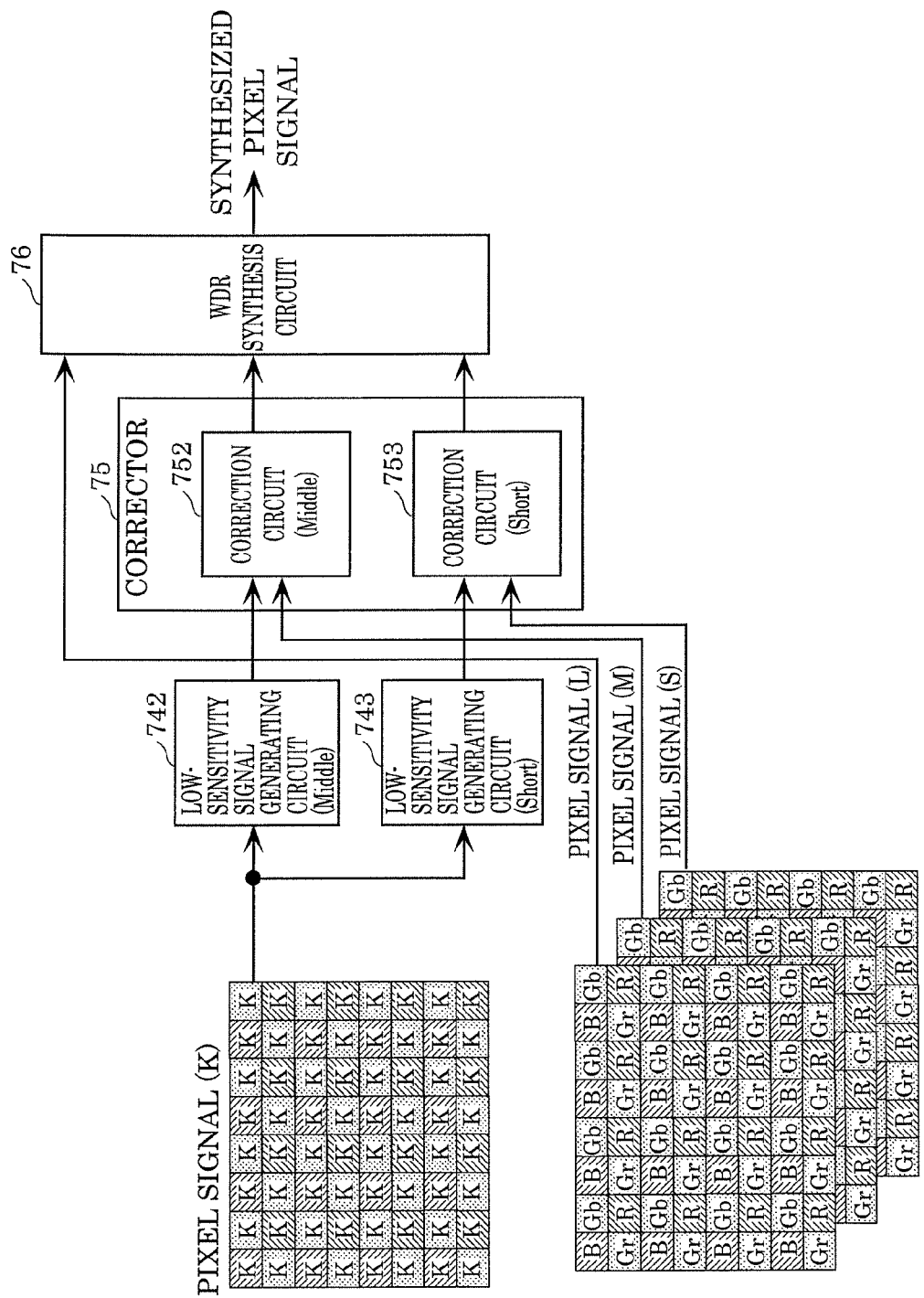
FIG. 9C is an explanatory diagram showing an operation example of the signal processor in FIG. 9A according to Embodiment 1.

FIG. 9A is a diagram showing the configuration example of signal processor 70 according to Embodiment 1. As illustrated in the drawing, signal processor 70 includes low-sensitivity signal generating circuit 742, low-sensitivity signal generating circuit 743, corrector 75, and WDR synthesis circuit 76. Corrector 75 includes correction circuit 752 and correction circuit 753. FIG. 9B is a configuration example of correction circuit 752 according to Embodiment 1. FIG. 9C is an explanatory diagram showing an operation example of signal processor 70 in FIG. 9A according to Embodiment 1. Note that correction circuit 753 may have the same configuration as in FIG. 9B.

As illustrated in FIGS. 9A and 9C, low-sensitivity signal generating circuit 742 generates a signal of a new second low-sensitivity frame by multiplying pixel signal (K) of low-sensitivity pixel K by a second coefficient. The second coefficient is for scale aligning pixel signal (K) of low-sensitivity pixel K to pixel signal (M) of the second high-sensitivity frame. For example, the second coefficient is determined depending on exposure time tK, second exposure time tM, the gain and sensitivity of high-sensitivity pixel PD, and the gain and sensitivity of low-sensitivity pixel K.

Low-sensitivity signal generating circuit 743 generates a signal of a new third low-sensitivity frame by multiplying pixel signal (K) of low-sensitivity pixel K by a third coefficient. The third coefficient is for scale aligning pixel signal (K) of low-sensitivity pixel K to pixel signal (S) of the third high-sensitivity frame. For example, the third coefficient is determined depending on exposure time tK, second exposure time tM, the gain and sensitivity of high-sensitivity pixel PD, and the gain and sensitivity of low-sensitivity pixel K.

Correction circuit 752 generates a second correction signal by detecting a difference signal between pixel signal (M) from the second high-sensitivity frame and a signal from the second low-sensitivity frame generated by low-sensitivity signal generating circuit 742, and correcting pixel signal (M) from the second high-sensitivity frame using the difference signal.

As illustrated in FIG. 9B, correction circuit 752 includes difference detection circuit 757 and addition circuit 758.

Difference detection circuit 757 detects the difference signal between pixel signal (M) from the second high-sensitivity frame and the signal from the second low-sensitivity frame.

Addition circuit 758 adds the difference signal from difference detection circuit 757 to pixel signal (M) of the second high-sensitivity frame, and outputs the addition result as the second correction signal.

Correction circuit 753 generates a third correction signal by detecting a difference signal between pixel signal (S) from the third high-sensitivity frame and a signal from the third low-sensitivity frame, and correcting pixel signal (S) from the third high-sensitivity frame using the difference signal. Correction circuit 753 detects a difference between pixel signal (S) of second high-sensitivity frame and the signal of the third low-sensitivity frame, adds the difference to pixel signal (S), and outputs the addition result as the third correction signal.

WDR synthesis circuit 76 generates a synthesized pixel signal by synthesizing pixel signal (L) from the first high-sensitivity frame, the second correction signal from correction circuit 752, and the third correction signal from correction circuit 753.

As illustrated in FIG. 9C, low-sensitivity signal generating circuit 742 and low-sensitivity signal generating circuit 743 generate the second low-sensitivity frame corresponding to first high-sensitivity frame (M) and the third low-sensitivity frame corresponding to third high-sensitivity frame (S) from pixel signal (K) of low-sensitivity pixel K for the WDR functionality, i.e., for increasing the dynamic range.

However, first high-sensitivity pixel frame (L), first high-sensitivity frame (M), and third high-sensitivity frame (S) are generated from high-sensitivity pixel PD by implementing the first exposure operation, the second exposure operation, and the third exposure operation, each having a different exposure time.

Subsequently, corrector 75 (i) corrects second high-sensitivity frame (M) and third high-sensitivity frame (S) with, respectively, the second low-sensitivity frame and the third low-sensitivity frame, and (ii) generates a corrected second high-sensitivity frame (M) and a corrected third high-sensitivity frame (S).

Subsequently, WDR synthesis circuit 76 synthesizes pixel signal (L) from the first high-sensitivity frame that is not corrected, corrected pixel signal (M) from the second high-sensitivity frame that is corrected, and corrected pixel signal (S) from the third high-sensitivity frame that is corrected. This synthesis makes it possible to implement the WDR functionality, i.e., increase the dynamic range.

A characteristics example and the dynamic range of the synthesized pixel signal of high-sensitivity pixel PD and low-sensitivity pixel K will be described next.

Figure 10:
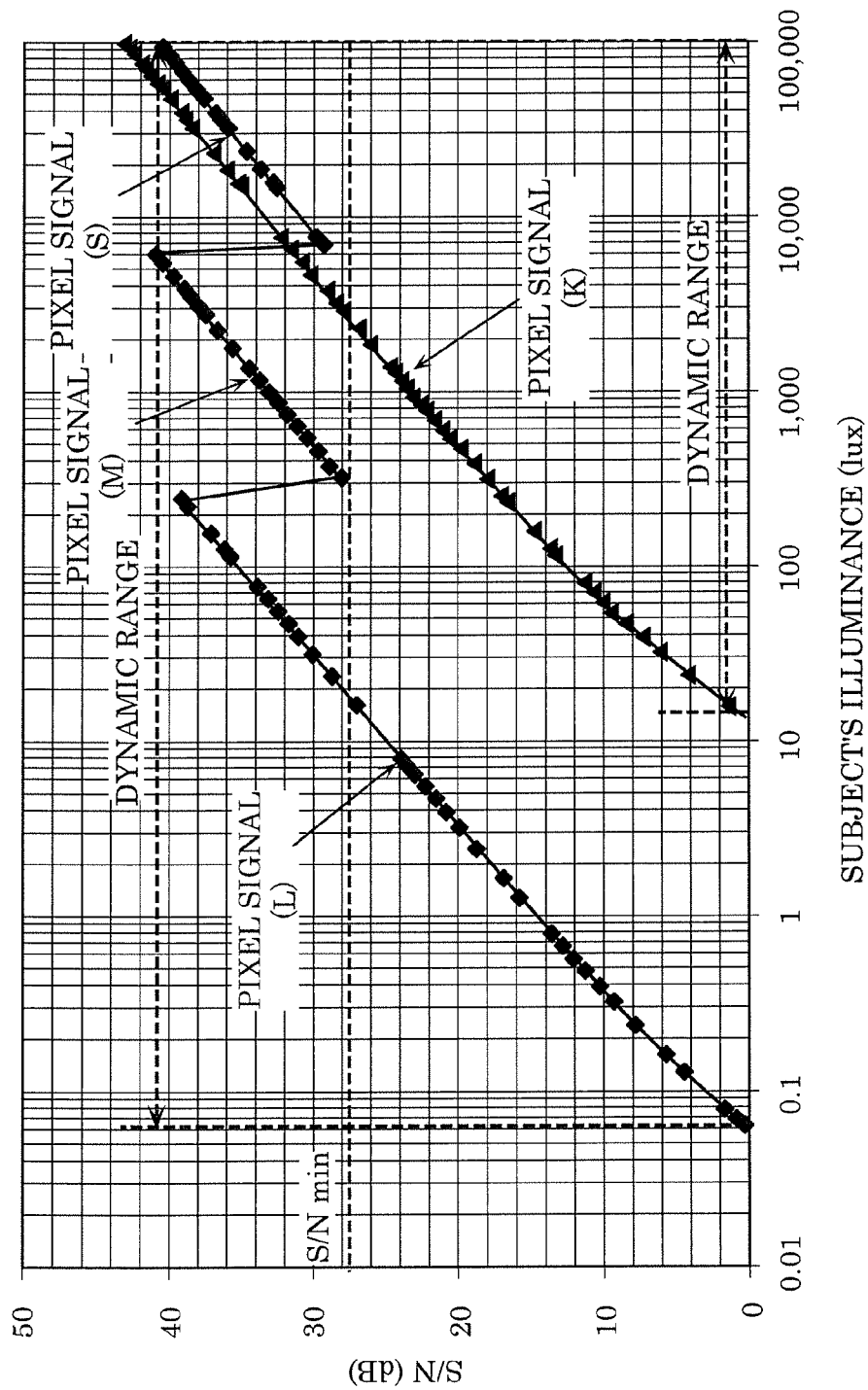
FIG. 10 is a diagram showing a characteristics example of the high-sensitivity pixel and the low-sensitivity pixel according to Embodiment 1 with respect to a subject's illuminance.

FIG. 10 is a diagram showing an example of photoelectric conversion characteristics of the high-sensitivity pixel and the low-sensitivity pixel according to Embodiment 1 with respect to a subject's illuminance.

FIG. 10 shows the output signals of pixel signal (L), pixel signal (M), and pixel signal (S) from high-sensitivity pixel PD in FIG. 9C connected to one another, and a S/N of an image with respect to the object's illuminance. FIG. 10 also shows a S/N of an image with respect to the output signal of pixel signal (K) of low-sensitivity pixel K and the object's illuminance.

In FIG. 10, a wide dynamic range can be obtained in a state in which a S/N at a boundary (knee point) of each exposure is satisfied.

In this manner, with regard to the exposure time, pixel signal (L), pixel signal (M), pixel signal (S), which are split up with different exposure times, are generated from high-sensitivity pixel PD for balancing a high S/N and the WDR. For example, exposure time tL:tM:tS may be approximately 256:16:1. Low-sensitivity pixel K may be exposed in parallel with high-sensitivity pixel PD, and the exposure time may be tK>tL+tM+tS. tK may have, for example, roughly the same duration as one vertical synchronization period, and may be between approximately 16.6 ms (=1/60 fps) of one vertical synchronization period and approximately 11 ms (=1/90 Hz) corresponding to a minimum frequency of LEDs.

Figure 11:
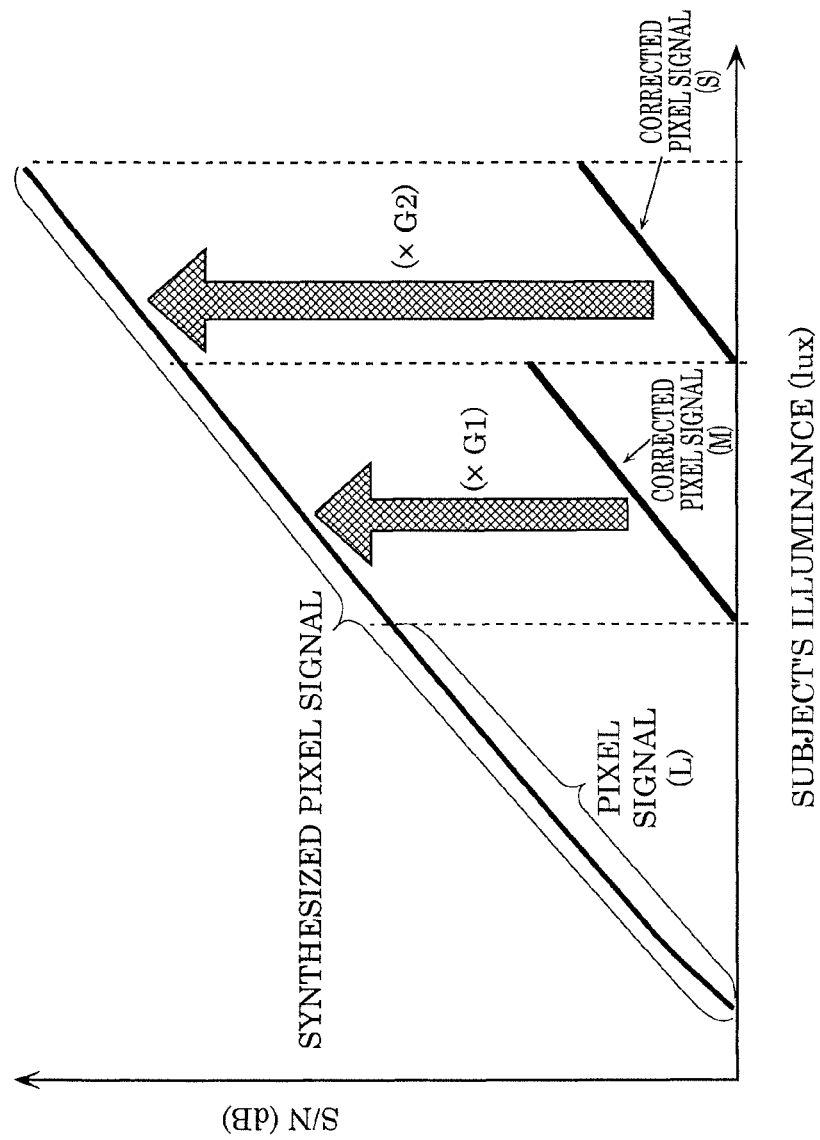
FIG. 11 is an explanatory diagram showing a wide dynamic range (WDR) synthesis example in the signal processor in FIG. 9A according to Embodiment 1.

FIG. 11 is an explanatory diagram showing a synthesis example in the signal processor in FIG. 9A according to Embodiment 1. As illustrated in FIG. 9C, pixel signal (L) of the first high-sensitivity frame, the second correction signal (i.e., corrected pixel signal (M)) from low-sensitivity signal generating circuit 742, and the third correction signal (i.e., corrected pixel signal (S)) from low-sensitivity signal generating circuit 743 are input into WDR synthesis circuit 76 and synthesizes these. In the synthesis example of FIG. 11, WDR synthesis circuit 76 generates a synthesized pixel signal by adding pixel signal (L), a signal that is corrected pixel signal (M) multiplied by synthesis coefficient G1, to a signal that is corrected pixel signal (S) multiplied by synthesis coefficient G2.

This makes it possible to obtain a pixel signal that balances flicker reduction and dynamic range expansion.

Solid-state imaging apparatus 1 in the above-described Embodiment 1 includes a plurality of high-sensitivity pixels that are arranged in a matrix, and perform a photoelectric conversion at a predetermined sensitivity; a plurality of low-sensitivity pixels that are arranged in a matrix in gaps between the plurality of high-sensitivity pixels, and perform a photoelectric conversion at a lower sensitivity than the predetermined sensitivity; and signal processor 70 that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal.

This makes it possible to easily reduce flicker and increase the dynamic range.

The high-sensitivity pixels may be exposed in parallel with the low-sensitivity pixels. An exposure time of the low-sensitivity pixels may be longer than an exposure time of the high-sensitivity pixels, shorter than one vertical synchronization period, and longer than a predetermined flicker cycle.

This makes it possible to sufficiently reduce flicker with respect to flicker cycles that are shorter than a predetermined flicker cycle. The predetermined flicker cycle may be the longest flicker cycle of a normal LED light source, e.g. an LED traffic light.

Signal processor 70 may add the difference signal to the signal from the high-sensitivity pixels as the correcting of the signal from the high-sensitivity pixels.

Since this enables the correcting to be a simple addition and subtraction without conditional determination, the correcting is suitable for simplifying and speeding up the configuration of the correction circuit.

Solid-state imaging apparatus 1 may generate, within one vertical scanning period, high-sensitivity frames by performing an exposure operation a plurality of times, each having a different exposure time, on the high-sensitivity pixels. Signal processor 70 may correct a signal of each of the high-sensitivity frames using the signal from the low-sensitivity pixels, and synthesize the corrected high-sensitivity frames.

With this, the dynamic range can easily be increased using the signals, each having a different exposure time in one vertical synchronization period, from the high-sensitivity pixels. Flicker can also be reduced thanks to the correcting.

Solid-state imaging apparatus 1 may generate, within one vertical scanning period, a first high-sensitivity frame, a second high-sensitivity frame, and a third high-sensitivity frame by respectively performing a first exposure operation that exposes the high-sensitivity pixels for a first exposure time, a second exposure operation that exposes the high-sensitivity pixels for a second exposure time, and a third exposure operation that exposes the high-sensitivity pixels for a third exposure time. The first exposure time may be longer than the second exposure time and the second exposure time may be longer than the third exposure time. Signal processor 70 may generate (i) a second low-sensitivity frame and a third low-sensitivity frame by multiplying a frame including the signal from the low-sensitivity pixels by, respectively, a second coefficient corresponding to the second exposure time and a third coefficient corresponding to the third exposure time, (ii) a second correction signal by detecting a difference signal between a signal from the second high-sensitivity frame and a signal from the second low-sensitivity frame, and correcting the signal from the second high-sensitivity frame using the difference signal, (iii) a third correction signal by detecting a difference signal between a signal from the third high-sensitivity frame and a signal from the third low-sensitivity frame, and correcting the signal from the third high-sensitivity frame using the difference signal, and (iv) the pixel signal by synthesizing a signal from the first high-sensitivity frame, the second correction signal and the third correction signal.

With this, the dynamic range can easily be increased using the three signals, each having a different exposure time in one vertical synchronization period, from the high-sensitivity pixels. Flicker can also be reduced thanks to the correcting.

Solid-state imaging apparatus 1 may include pixel circuits 3 arranged in a matrix. Pixel circuits 3 may each include at least one high-sensitivity pixel; floating diffusion layer FD that retains signal charge; a first transfer transistor that is disposed corresponding to the at least one high-sensitivity pixel, and transfers signal charge of the at least one high-sensitivity pixel to floating diffusion layer FD; at least one low-sensitivity pixel; a second transfer transistor that is disposed corresponding to the at least one low-sensitivity pixel, and transfers signal charge of the at least one low-sensitivity pixel to floating diffusion layer FD; and transistor GC that electrically disconnects or connects the second transfer transistor and floating diffusion layer FD.

Solid-state imaging apparatus 1 may further include control electrode PG that is disposed at each low-sensitivity pixel, and covers a portion of the low-sensitivity pixels. Control electrode PG may control a potential of a surface of each of the low-sensitivity pixels in accordance with a voltage applied to control electrode PG.

Another configuration example of signal processor 70 in Embodiment 1 will be described next.

Figure 12A:
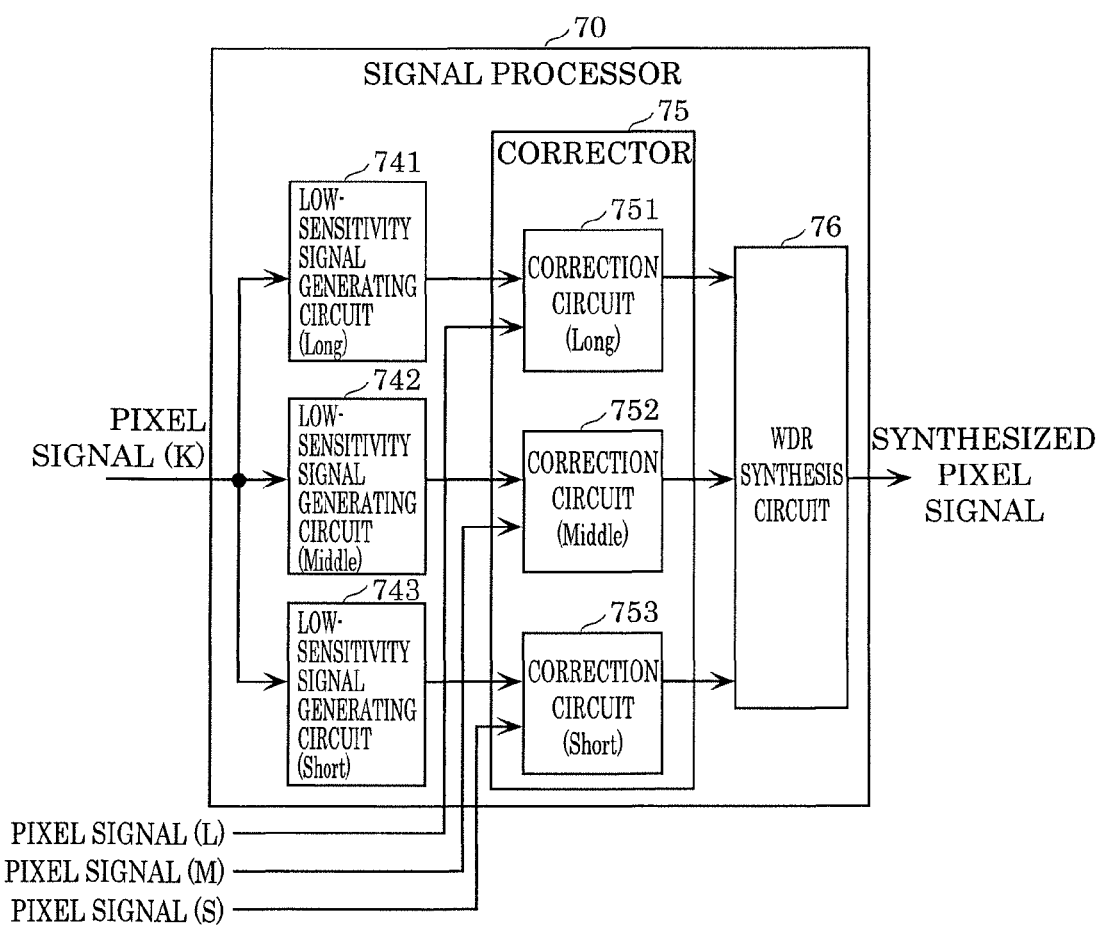
FIG. 12A is a diagram showing another configuration example of the signal processor according to Embodiment 1.

FIG. 12A is a diagram showing another configuration example of signal processor 70 according to Embodiment 1.

Figure 12B:
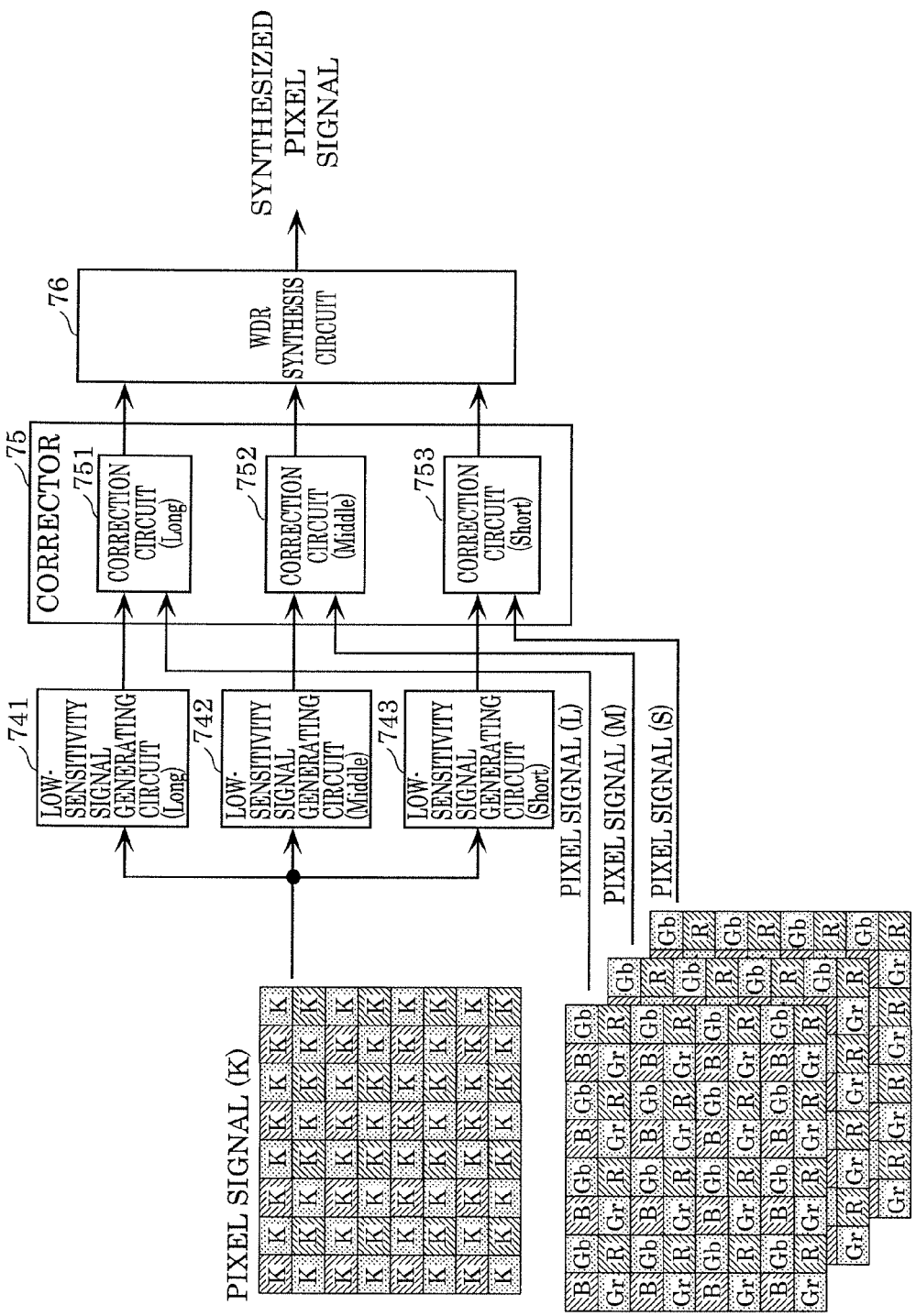
FIG. 12B is an explanatory diagram showing an operation example of the signal processor in FIG. 12A according to Embodiment 1.

FIG. 12B is an explanatory diagram showing an operation example of signal processor 70 in FIG. 12A according to Embodiment 1.

FIG. 12A mainly differs from FIG. 9A in that low-sensitivity signal generating circuit 741 and correction circuit 751 have been added. Hereinafter, differences will mainly be described.

Low-sensitivity signal generating circuit 741 generates the first low-sensitivity frame from pixel signal (K) of low-sensitivity pixel K. To be specific, signal processor 70 generates a first low-sensitivity frame, a second low-sensitivity frame and a third low-sensitivity frame by multiplying a frame including pixel signal (K) from low-sensitivity pixel K by, respectively, a first coefficient corresponding to first exposure time tL, a second coefficient corresponding to second exposure time tM, and a third coefficient corresponding to third exposure time tS. The first coefficient is for scale aligning pixel signal (K) of low-sensitivity pixel K to pixel signal (L) of the first high-sensitivity frame. For example, the first coefficient is determined depending on exposure time tK, first exposure time tL, the gain and sensitivity of high-sensitivity pixel PD, and the gain and sensitivity of low-sensitivity pixel K.

Correction circuit 751 has the same internal configuration as correction circuit 752, and generates a first correction signal by detecting a difference signal between pixel signal (L) from the first high-sensitivity frame and a signal from the first low-sensitivity frame generated by low-sensitivity signal generating circuit 741, and correcting pixel signal (L) from the first high-sensitivity frame using the difference signal.

WDR synthesis circuit 76 generates a synthesized pixel signal by synthesizing the first correction signal from correction circuit 751, the second correction signal from correction circuit 752, and the third correction signal from correction circuit 753.

As illustrated in FIG. 12B, low-sensitivity signal generating circuits 741, 742, and 743 in FIG. 12A respectively generate the first low-sensitivity frame, the second low-sensitivity frame, and the third low-sensitivity frame from pixel signal (K) of low-sensitivity pixel K for the WDR functionality.

However, the first high-sensitivity frame, the second high-sensitivity frame, and the third high-sensitivity frame, whose exposure time are changed, are generated from high-sensitivity pixel PD.

Subsequently, corrector 75 (i) corrects first high-sensitivity frame (L), second high-sensitivity frame (M), and third high-sensitivity frame (S) with, respectively, the first low-sensitivity frame, the second low-sensitivity frame, and the third low-sensitivity frame, and (ii) generates a corrected first high-sensitivity frame (L), a corrected second high-sensitivity frame (M) and a corrected third high-sensitivity frame (S).

Subsequently, WDR synthesis circuit 76 synthesizes corrected pixel signal (L) from the corrected first high-sensitivity frame, corrected pixel signal (M) from the second high-sensitivity frame that is corrected, and corrected pixel signal (S) from the third high-sensitivity frame that is corrected. This synthesis makes it possible to implement the WDR functionality, i.e., increase the dynamic range.

Figure 13:
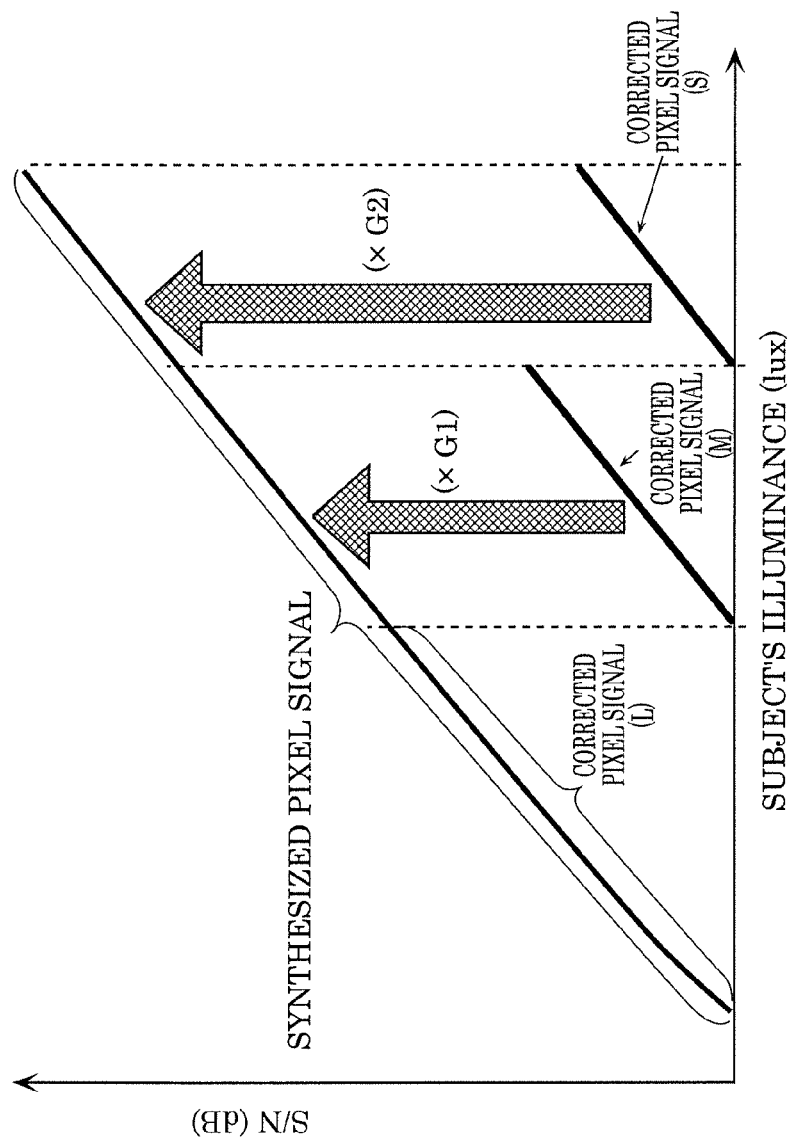
FIG. 13 is an explanatory diagram showing a WDR synthesis example in the signal processor in FIG. 12A according to Embodiment 1.

FIG. 13 is an explanatory diagram showing a synthesis example in signal processor 70 in FIG. 12A according to Embodiment 1. As illustrated in FIG. 12A, a first correction signal (i.e., pixel signal (L)) from low-sensitivity signal generating circuit 741, the second correction signal (i.e., corrected pixel signal (M)) from low-sensitivity signal generating circuit 742, and the third correction signal (i.e., corrected pixel signal (S)) from low-sensitivity signal generating circuit 743 are input to WDR synthesis circuit 76 and synthesizes these. In the synthesis example of FIG. 13, WDR synthesis circuit 76 generates a synthesized pixel signal by adding corrected pixel signal (L), the signal that is corrected pixel signal (M) multiplied by synthesis coefficient G1, and the signal that is corrected pixel signal (S) multiplied by synthesis coefficient G2.

This makes it possible to obtain a pixel signal that balances flicker reduction and dynamic range expansion. The synthesized pixel signal in FIG. 13 can reliably be reduced in flicker more than the synthesized pixel signal in FIG. 11 since the synthesized pixel signal uses corrected pixel signal (L) instead of pixel signal (L).

Solid-state imaging apparatus 1 in another configuration example in the above Embodiment 1 generates, within one vertical scanning period, a first high-sensitivity frame, a second high-sensitivity frame, and a third high-sensitivity frame by respectively performing a first exposure operation that exposes the high-sensitivity pixels for a first exposure time, a second exposure operation that exposes the high-sensitivity pixels for a second exposure time, and a third exposure operation that exposes the high-sensitivity pixels for a third exposure time. The first exposure time is longer than the second exposure time and the second exposure time is longer than the third exposure time. Signal processor 70 generates (i) a second low-sensitivity frame and a third low-sensitivity frame by multiplying a frame including the signal from the low-sensitivity pixels by, respectively, a second coefficient corresponding to the second exposure time and a third coefficient corresponding to the third exposure time, (ii) a second correction signal by detecting a difference signal between a signal from the second high-sensitivity frame and a signal from the second low-sensitivity frame, and correcting the signal from the second high-sensitivity frame using the difference signal, (iii) a third correction signal by detecting a difference signal between a signal from the third high-sensitivity frame and a signal from the third low-sensitivity frame, and correcting the signal from the third high-sensitivity frame using the difference signal, and (iv) the pixel signal by synthesizing a signal from the first high-sensitivity frame, the second correction signal and the third correction signal.

Embodiment 2

Solid-state imaging apparatus 1 in Embodiment 2 will be described next. A configuration example of solid-state imaging apparatus 1 including low-sensitivity pixels K1 and K2 instead of low-sensitivity pixel K will be described in Embodiment 2.

Figure 14:
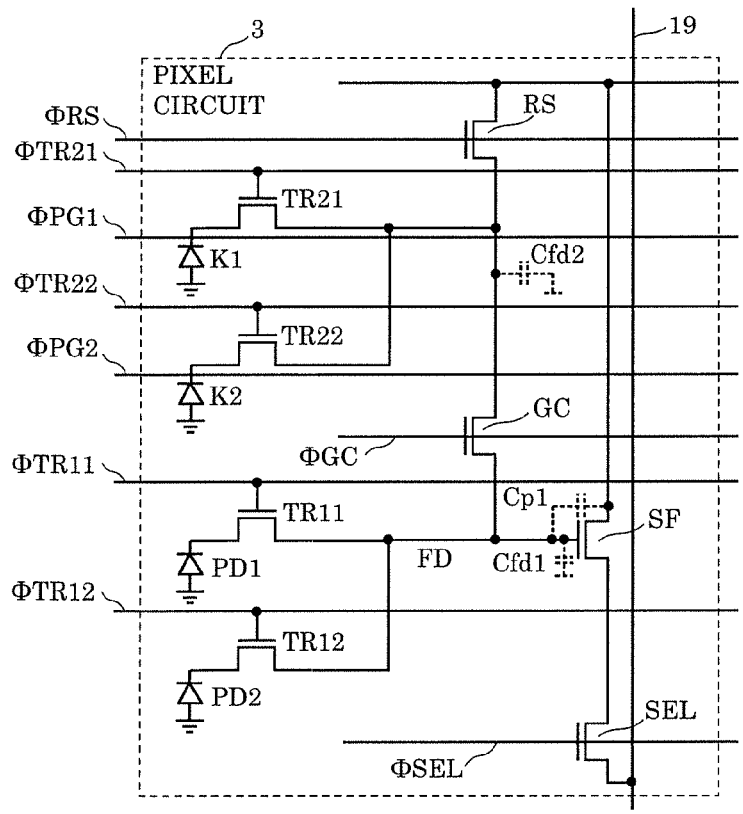
FIG. 14 is a diagram showing a circuitry example of a pixel circuit according to Embodiment 2.

FIG. 14 is a diagram showing a circuitry example of pixel circuit 3 according to Embodiment 2.

Pixel circuit 3 in FIG. 14 includes, as a four pixels per cell structure, high-sensitivity pixels PD1 and PD2, low-sensitivity pixels K1 and K2, readout transistors TR11 and TR12 respectively corresponding to high-sensitivity pixels PD1 and PD2, readout transistors TR21 and TR22 respectively corresponding to low-sensitivity pixels K1 and K2, reset transistor RS, gain control transistor GC, floating diffusion layer FD, amplification transistor SF, and selection transistor SEL.

High-sensitivity pixels PD1 and PD2 and low-sensitivity pixels K1 and K2 are each light-receiving elements that perform a photoelectric conversion, and generate an electric charge depending on the amount of light received. High-sensitivity pixel PD1 and high-sensitivity pixel PD2 have the same sensitivity. Low-sensitivity pixel K1 and low-sensitivity pixel K2 each have a different sensitivity. High-sensitivity pixel PD1 and low-sensitivity pixel K1 form a pair, and high-sensitivity pixel PD2 and low-sensitivity pixel K2 form a pair.

Floating diffusion layer FD temporarily retains each of the electric charges read out by readout transistors TR11, TR12, TR21, and TR22 from high-sensitivity pixels PD1 and PD2 and low-sensitivity pixels K1 and K2.

Figure 15:
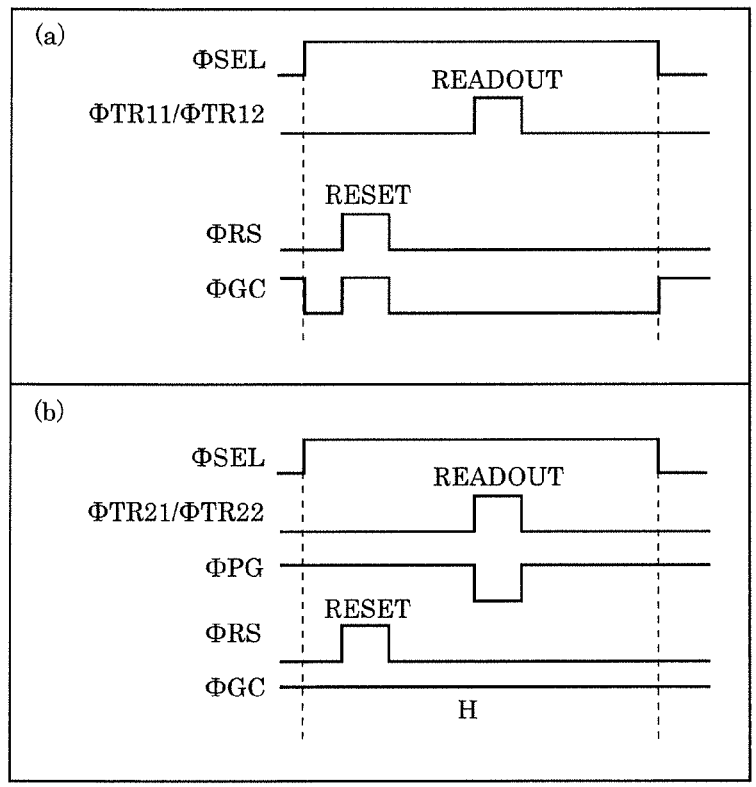
FIG. 15 is a timing diagram showing an operation example of a pixel readout with gain control according to Embodiment 2.

FIG. 15 is a timing diagram showing an operation example of a pixel readout with gain control. Gain that converts the signal charge in floating diffusion layer FD to a voltage can be switched between high gain and low gain in accordance with gain control transistor GC being turned on and off. Image (a) of FIG. 15 shows the readout operation of the signal charge from high-sensitivity pixels PD1 and PD2 to floating diffusion layer FD having a high conversion gain. Image (b) of FIG. 15 shows the readout operation of the signal charge from low-sensitivity pixels K1 and K2 to floating diffusion layer FD having a low conversion gain.

In image (a) of FIG. 15, floating diffusion layer FD is reset by a positive pulse of reset control signal (RS, and the signal charge is forwarded from high-sensitivity pixel PD1 or PD2 by a positive pulse of readout control signal ΦTR11 or ΦTR12. When readout control signal ΦTR11 or ΦTR12 is at a high level, gain control signal ΦGC is at a low level and gain control transistor GC is turned off. In other words, the capacitance of floating diffusion layer FD becomes mainly Cfd1 and the FD conversion gain increases.

In image (b) of FIG. 15, floating diffusion layer FD is reset with a positive pulse of reset control signal (RS, and the signal charge is forwarded from low-sensitivity pixel K1 or K2 with a positive pulse of readout control signal ΦTR21 or ΦTR22. When readout control signal ΦTR21 or ΦTR22 is at a high level, gain control signal ΦGC is at a high level and gain control transistor GC is turned on. In other words, the capacitance of floating diffusion layer FD mainly becomes Cfd1+Cfd2 and the FD conversion gain decreases.

In this manner, when gain control transistor GC is at a low level during the readout, the conversion gain of floating diffusion layer FD increases due to gain control signal (GC. On the other hand, when gain control transistor GC is at a high level during the readout, the conversion gain of floating diffusion layer FD decreases.

Low-sensitivity pixels K1 and K2 can make the signal charge amount, which is accumulable proximate to the surface of low-sensitivity pixel K by control voltage (PG, and the saturation level variable. As shown in image (b) of FIG. 15, during the exposure time, control voltage ΦPG is at a high level and more signal charge can be accumulated. During the readout, control voltage ΦPG is at a low level and the signal charge is emitted.

Note that in FIG. 14, an example of pixel circuit 3 with a so-called four pixels per cell structure is shown, but pixel circuit 3 may also have another multiple pixels per cell structure aside from four pixels per cell. One unit cell of the multiple pixels per cell structure may include, for example, a plurality of photoelectric conversion elements, and have a structure in which any one of or all of floating diffusion layer FD, reset transistor RS, amplification transistor SF, and selection transistor SEL are shared within one unit cell.

Figure 16A:
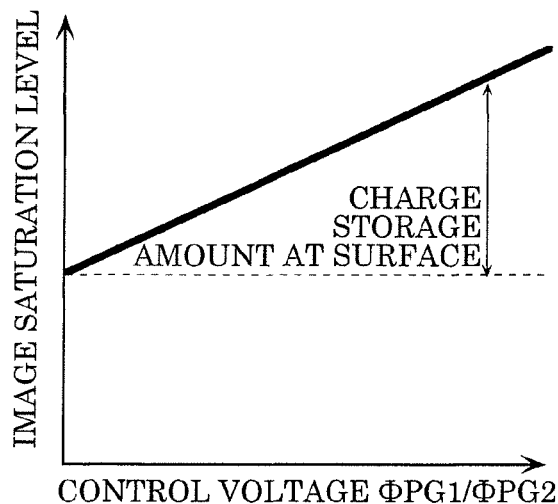
FIG. 16A is a diagram showing a control voltage and pixel saturation level of the low-sensitivity pixels according to Embodiment 2.
Figure 16B:
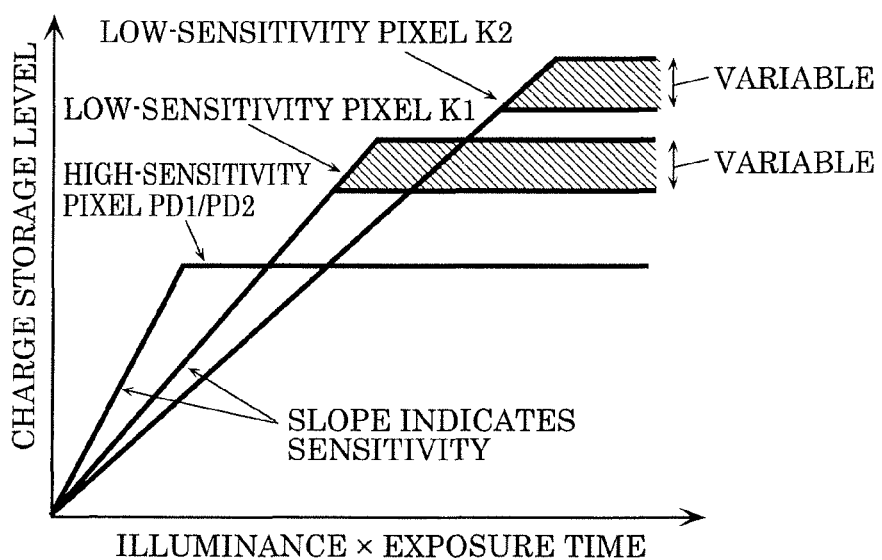
FIG. 16B is a diagram showing illuminance×exposure time and a charge storage level according to Embodiment 2.

FIG. 16A is a diagram showing a control voltage and pixel saturation level of low-sensitivity pixels K1 and K2 according to Embodiment 2. FIG. 16B is a diagram showing illuminance×exposure time and a charge storage level according to Embodiment 2.

FIG. 16A shows the saturation level of low-sensitivity pixels K1 and K2 as changeable by control voltages ΦPG1 and ΦPG2, similar to FIG. 6A. Since control electrode PG of low-sensitivity pixel K is characterized as such, (control voltage ΦPG1<control voltage ΦPG2) in order to attain (saturation-sensitivity ratio of low-sensitivity pixel K1)< (saturation-sensitivity ratio of low-sensitivity pixel K2), as illustrated in FIG. 16B.

The sensitivity of low-sensitivity pixels K1 and K2 can be adjusted by laminating a ND filter, e.g. gray filter, to an (R, Gr, B, Gb) on-chip filter and adjusting a thickness and laminated region of this filter. An alternative method to the ND filter is performing a metal shielding and adjusting the area of an aperture area and sensitivity. The shutter and readout use a rolling motion.

In FIG. 16B, since it is possible to adjust the saturation level and the sensitivity level separately, the slope of the charge storage level and the saturation level can be set to a suitable value with respect to the illuminance and the exposure time. As a result, the saturation-sensitivity ratio can be adjusted and the dynamic range of the pixels can be freely adjusted.

Figure 17:
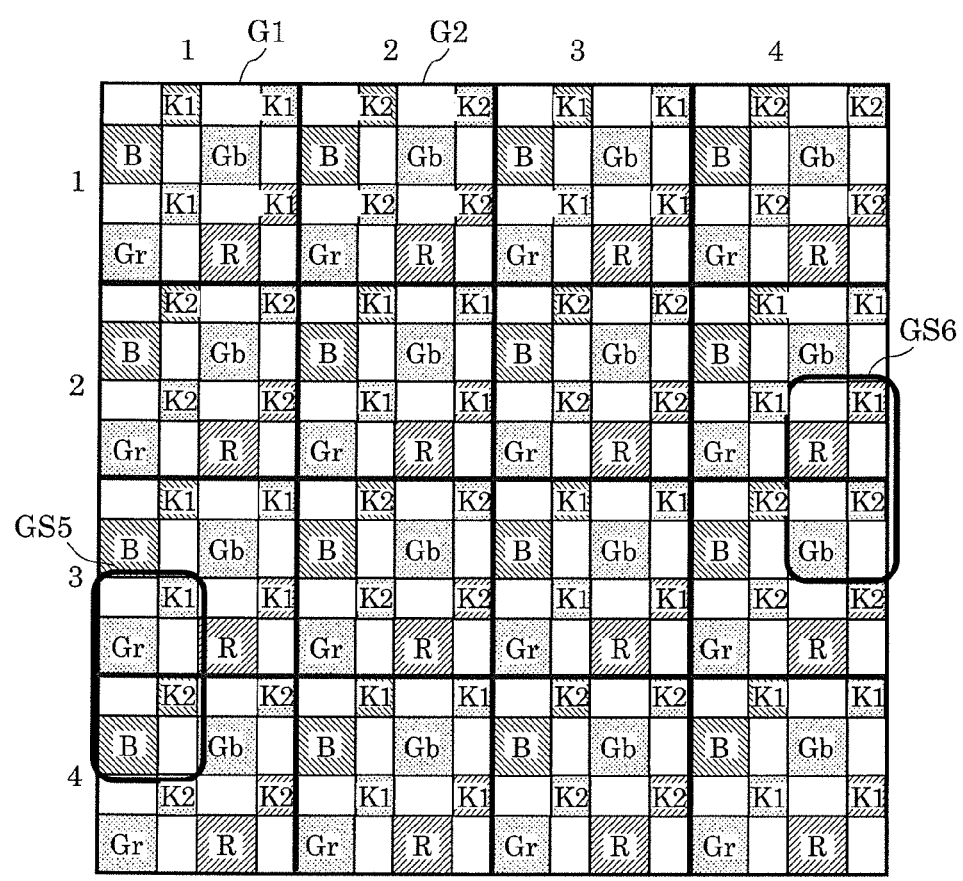
FIG. 17 is a diagram showing an arrangement example of the high-sensitivity pixels and the low-sensitivity pixels according to Embodiment 2.

FIG. 17 is a diagram showing an arrangement example of high-sensitivity pixels PD1 and PD2 and low-sensitivity pixels K1 and K2 according to Embodiment 2.

As illustrated in FIG. 17, solid-state imaging apparatus 1 according to the present embodiment includes first pixel groups G1 and second pixel groups G2. First pixel groups G1 each include four high-sensitivity pixels PD1 disposed in a square region, and four low-sensitivity pixels K1 disposed in the square region. Second pixel groups G2 each include four high-sensitivity pixels PD2 disposed in a square region, and four low-sensitivity pixels K2 disposed in the square region. First pixel groups G1 and second pixel groups G2 are alternately disposed in rows and columns.

In other words, first pixel groups G1 and G2 each have a basic configuration of four high-sensitivity pixels and four low-sensitivity pixels.

The four high-sensitivity pixel PD1 or PD2 are indicated by (R, Gr, B, and Gb). Low-sensitivity pixels with a low saturation-sensitivity ratio are collectively called K1 and low-sensitivity pixels with a high saturation-sensitivity ratio are collectively called K2. First pixel groups G1 include four high-sensitivity pixels (R, Gr, B, and Gb) and four respectively corresponding low-sensitivity pixels K1. Second pixel groups G2 include four high-sensitivity pixels (R, Gr, B, and Gb) and four respectively corresponding low-sensitivity pixels K2. Four high-sensitivity pixels PD1 or PD2 in first pixel groups G1 or second pixel groups form a Bayer arrangement. Similarly, four low-sensitivity pixels K1 also form a Bayer arrangement. Similarly, four low-sensitivity pixels K2 also form a Bayer arrangement.

Low-sensitivity pixel K1 and low-sensitivity pixel K2 each have a different saturation-sensitivity ratio. For example, low-sensitivity pixel K1 has a lower saturation-sensitivity ratio than low-sensitivity pixel K2.

This makes it possible to increase the dynamic range of a light signal of low-sensitivity pixels K1 and K2, and, for example, to receive a signal transmitted from a signaler with a comparatively low illuminance to a headlight with a high illuminance in the same frame with respect to a light-emitting source repeatedly turned on and off (pulsed light-emitting source, LED light source). Note that the configuration example of pixel circuit 3 shown in FIG. 14 corresponds to pixel groups GS5 and GS6 in FIG. 17.

Exposure operations of high-sensitivity pixels PD1 and PD2 and low-sensitivity pixels K1 and K2 in solid-state imaging apparatus 1 will be described next.

Figure 18A:
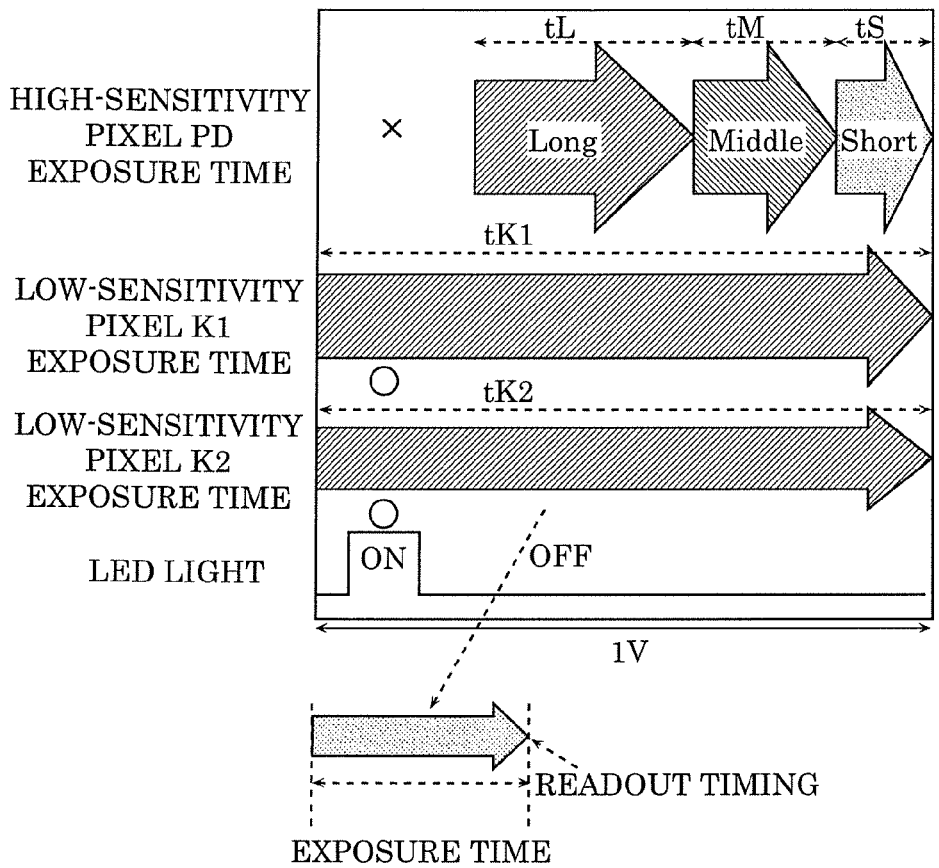
FIG. 18A is a diagram showing an example of an exposure operation of the high-sensitivity pixels and the low-sensitivity pixels according to Embodiment 2.
Figure 18B:
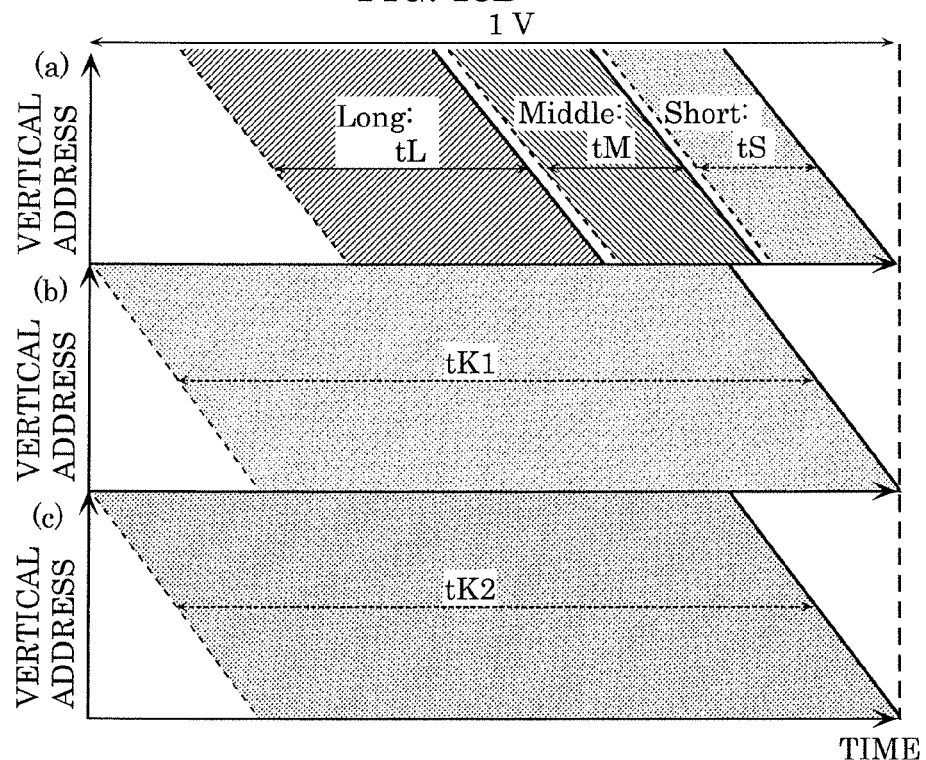
FIG. 18B is a diagram showing an example of an exposure operation and row scanning of the high-sensitivity pixels and the low-sensitivity pixels according to Embodiment 2.

FIG. 18A is a diagram showing an example of the exposure times of high-sensitivity pixels PD1 and PD2 and low-sensitivity pixels K1 and K2 according to Embodiment 2. FIG. 18B is a diagram showing an example of the exposure times and row scanning of high-sensitivity pixels PD1 and PD2 and low-sensitivity pixels K1 and K2 according to Embodiment 2.

High-sensitivity pixel PD1 has the same sensitivity and saturation level as high-sensitivity pixel PD2. Similar to high-sensitivity pixel PD shown in FIGS. 8A and 8B, solid-state imaging apparatus 1 apparatus generates, within vertical scanning period 1V, first high-sensitivity frame (L), second high-sensitivity frame (M), and third high-sensitivity frame (S) by respectively performing first exposure operation (Long) that exposes high-sensitivity pixels PD1 and PD2 for first exposure time tL, second exposure operation (Middle) that exposes high-sensitivity pixels PD1 and PD2 for second exposure time tM, and third exposure operation (Short) that exposes high-sensitivity pixels PD1 and PD2 for third exposure time tS.

Solid-state imaging apparatus 1, generates, within vertical scanning period 1V, low-sensitivity frame (K1) by performing an exposure operation that exposes low-sensitivity pixel K1 for exposure time (tK1) corresponding to one vertical scanning period. Similarly, solid-state imaging apparatus 1, generates, within vertical scanning period 1V, low-sensitivity frame (K2) by performing an exposure operation that exposes low-sensitivity pixel K2 for exposure time (tK2) corresponding to one vertical scanning period.

Note that in FIG. 18B, the readouts of low-sensitivity pixel K1 and low-sensitivity pixel K2 are performed at the same time since low-sensitivity pixel K1 and low-sensitivity pixel K2 are disposed in the same rows.

Solid-state imaging apparatus 3 according to the present embodiment exposes the high-sensitivity pixels three times, exposure times tL, tM, and tS, which are split up with different durations, for increasing the dynamic range of the high-sensitivity pixels. Low-sensitivity pixels K1 and K2 are exposed for a longer exposure time in parallel with the high-sensitivity pixels. In other words, tK1>tL+tM+tS and tK2>tL+tM+tS.

The LED light in the drawing cannot be exposed with exposure operations (Long, Middle, and Short) of the high-sensitivity pixel (×mark), but can be exposed in low-sensitivity pixels K1 and K2 (O mark), and flicker reduction is possible upon correcting the signal of the high-sensitivity pixel with the signal of the low-sensitivity pixels.

Note that in FIG. 18B, an output sequence of the high-sensitivity pixels and the low-sensitivity pixels are the rolling shutter motion in the row scanning, and the exposure times of low-sensitivity pixels K1 and K2 can be freely configured.

By making exposure times tK1 and tK2 of low-sensitivity pixels K1 and K2 roughly the same duration as one vertical scanning period, the lighting signal can reliably be captured with the low-sensitivity pixels when capturing a light-emitting source repeatedly and cyclically turned on and off (pulsed light-emitting source, LED light source).

For example, low-sensitivity pixel K1 has a lower saturation-sensitivity ratio than low-sensitivity pixel K2. With regard to the problem of the pixel saturation, external light with low illuminance (pulsed light, LED light, LD light) can be captured in low-sensitivity pixel K1 (saturation-sensitivity ratio: low). However, external light with high illuminance (pulsed light, LED light, LD light) can be captured in low-sensitivity pixel K2 (saturation-sensitivity ratio: high). In other words, with regard to the lighting signal problem, light can be continuously received along the time axis, and with regard to the dynamic range problem, low-sensitivity pixels K1 and K2 can receive light more broadly.

Configuration Example of Signal Processor 70

A configuration of signal processor 70 will be described next.

Figure 19A:
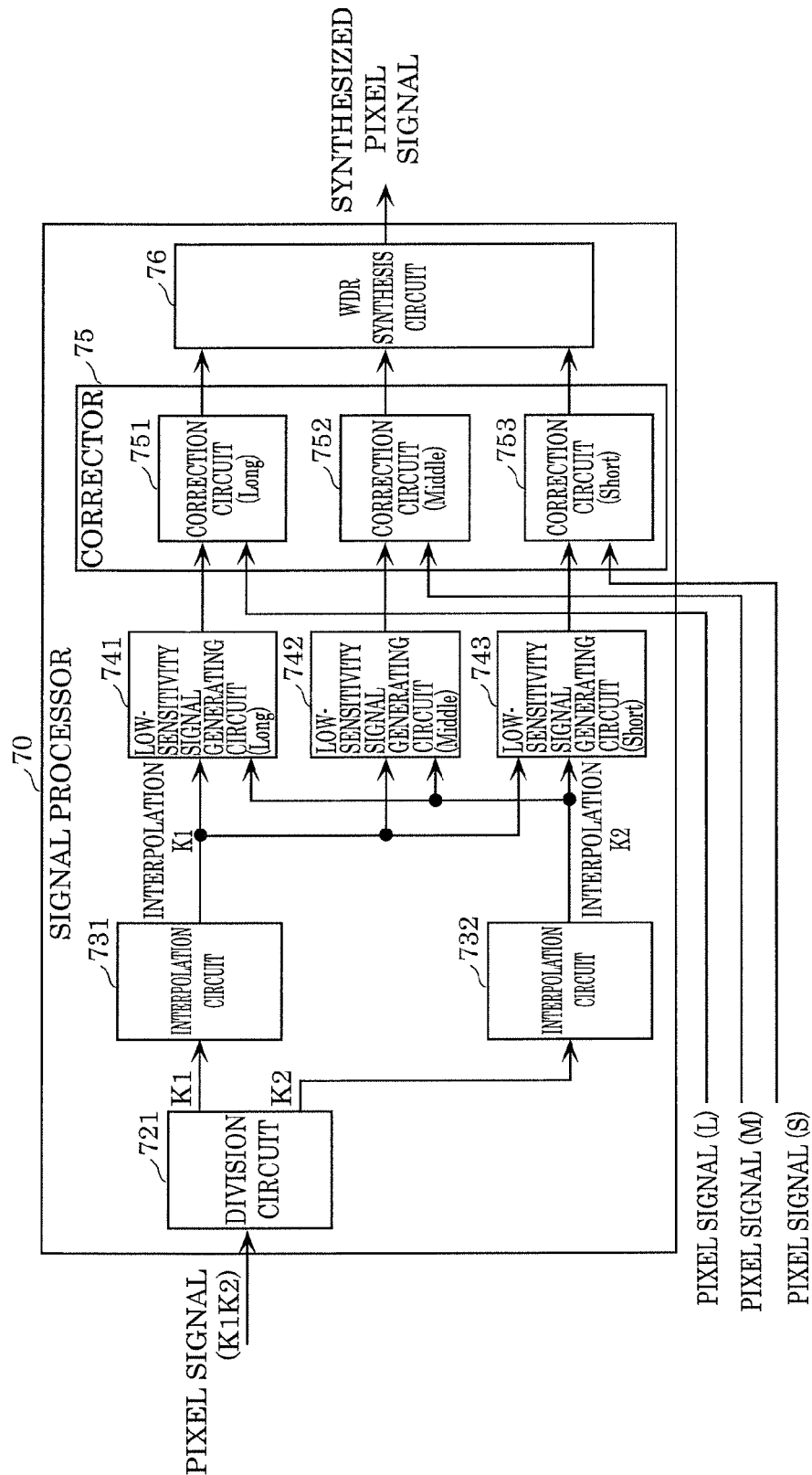
FIG. 19A is a diagram showing a configuration example of the signal processor according to Embodiment 2.
Figure 19B:
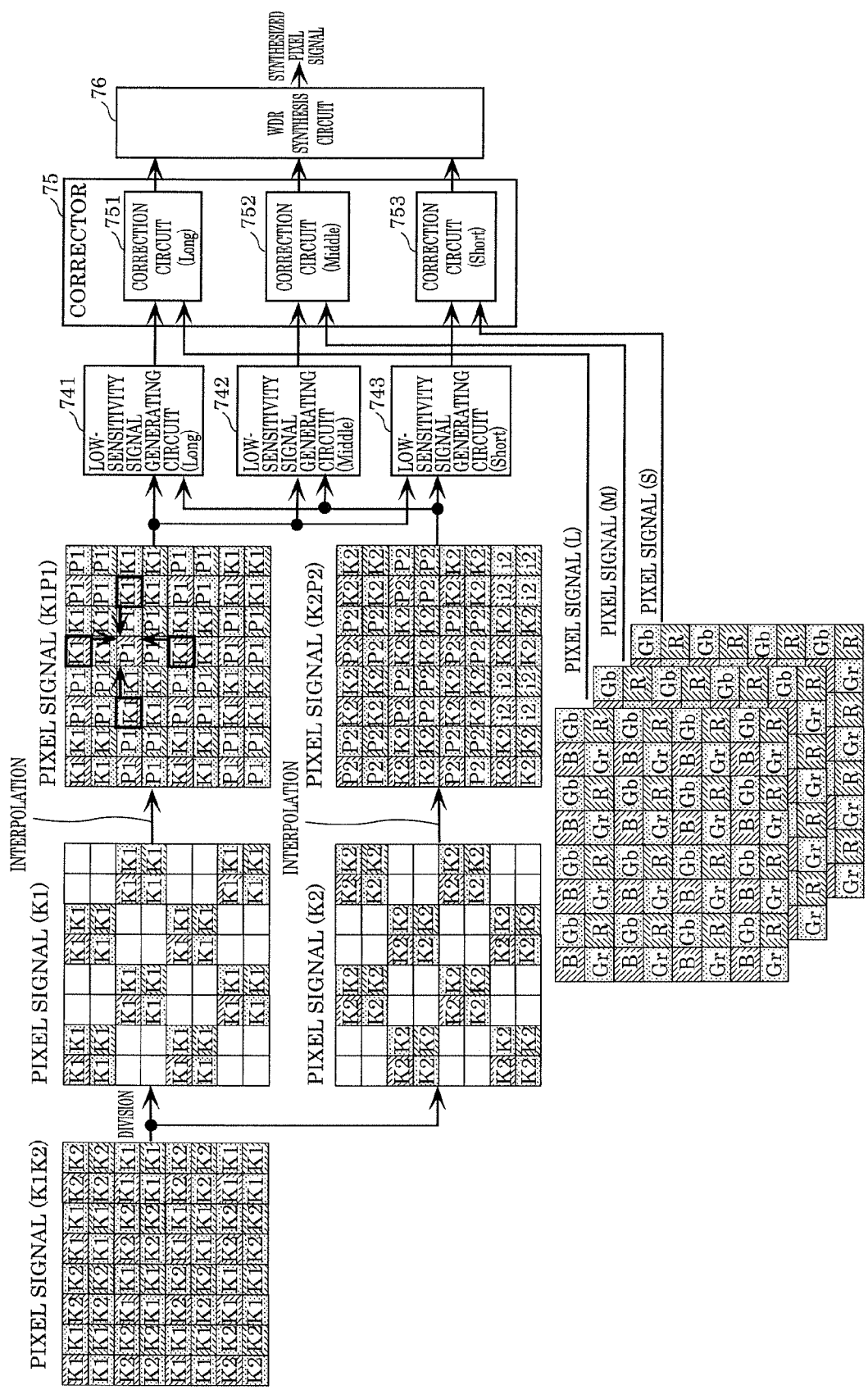
FIG. 19B is an explanatory diagram showing an operation example of the signal processor in FIG. 19A according to Embodiment 2.

FIG. 19A is a diagram showing the configuration example of signal processor 70 according to Embodiment 2. FIG. 19B is an explanatory diagram showing an operation example of signal processor 70 in FIG. 19A according to Embodiment 2. Note that correction circuits 751 and 753 may have the same configuration as in FIG. 9B.

FIG. 19A mainly differs from FIG. 12A in that division circuit 721, interpolation circuit 731, and interpolation circuit 732 have been added, and that low-sensitivity signal generating circuits 741 to 743 have different operations. Hereinafter, differences with FIG. 12A will mainly be described.

As illustrated in FIG. 19B, division circuit 721 divides the low-sensitivity frame, which is a mixture of pixel signal (K1) of low-sensitivity pixel K1 and pixel signal (K2) of low-sensitivity pixel K2, into low-sensitivity frame (K1) including pixel signal (K1) and low-sensitivity frame (K2) including pixel signal (K2).

Interpolation circuit 731 interpolates the pixel signal missing in low-sensitivity frame (K1) and generates interpolated low-sensitivity frame (K1). In other words, interpolation circuit 731 generates interpolated low-sensitivity frame (K1) including pixel signals (K1) obtained from low-sensitivity pixels K1, interpolated signals (P1) obtained through interpolation using pixel signals (K1). Interpolated signal (P1) uses at least four surrounding pixel signals (K1) and is generated by weighted interpolation depending on a center of gravity.

Interpolation circuit 732 interpolates the pixel signal missing in low-sensitivity frame (K2) and generates interpolated low-sensitivity frame (K2). In other words, interpolation circuit 732 generates interpolated low-sensitivity frame (K2) including pixel signals (K2) obtained from low-sensitivity pixels K2, interpolated signals (P2) obtained through interpolation using pixel signals (K2). Interpolated signal (P2) uses at least four surrounding pixel signals (K2) and is generated by weighted interpolation depending on a position of gravity.

Low-sensitivity signal generating circuit 741 generates first low-sensitivity frame (L) for correcting first high-sensitivity frame (L) by synthesizing the pixel signal (K1 or P1) of interpolated low-sensitivity frame (K1) and the pixel signal (P2 or K2) of interpolated low-sensitivity frame (K2). To be specific, low-sensitivity signal generating circuit 741 multiplies the pixel signal (K1 or P1) of interpolated low-sensitivity frame (K1) by a first type first coefficient and the pixel signal (P2 or K2) of interpolated low-sensitivity frame (K2) by a second type first coefficient.

First type first coefficient here depends on first exposure time tL and exposure time tK1 of low-sensitivity pixel K1, and is a coefficient for scale aligning the pixel signal (K1 or P1) of interpolated low-sensitivity frame (K1) to pixel signal (L) of the first high-sensitivity frame. For example, the first type first coefficient is determined depending on exposure time tK1, first exposure time tL, the gain and sensitivity of high-sensitivity pixel PD, and the gain and sensitivity of low-sensitivity pixel K1. Similarly, the second type first coefficient depends on first exposure time tL and exposure time tK2 of low-sensitivity pixel K2, and is a coefficient for scale aligning the pixel signal (K2 or P2) of interpolated low-sensitivity frame (K2) to pixel signal (L) of the first high-sensitivity frame. For example, the second type first coefficient is determined depending on exposure time tK2, first exposure time tL, the gain and sensitivity of high-sensitivity pixel PD, and the gain and sensitivity of low-sensitivity pixel K2.

Low-sensitivity signal generating circuit 741 generates first low-sensitivity frame (L) by synthesizing (i) interpolated low-sensitivity frame (K1) multiplied by the first type first coefficient and (ii) interpolated low-sensitivity frame (K2) multiplied by the second type first coefficient.

Low-sensitivity signal generating circuit 742 generates second low-sensitivity frame (M) for correcting second high-sensitivity frame (M) by synthesizing the pixel signal (K1 or P1) of interpolated low-sensitivity frame (K1) and the pixel signal (P2 or K2) of interpolated low-sensitivity frame (K2). To be specific, low-sensitivity signal generating circuit 742 multiplies the pixel signal (K1 or P1) of interpolated low-sensitivity frame (K1) by a first type second coefficient and the pixel signal (P2 or K2) of interpolated low-sensitivity frame (K2) by a second type second coefficient.

First type second coefficient here depends on second exposure time tM and exposure time tK1 of low-sensitivity pixel K1, and is a coefficient for scale aligning the pixel signal (K1 or P1) of interpolated low-sensitivity frame (K1) to pixel signal (M) of the second high-sensitivity frame. For example, the first type second coefficient is determined depending on exposure time tK1, second exposure time tM, the gain and sensitivity of high-sensitivity pixel PD, and the gain and sensitivity of low-sensitivity pixel K1. Similarly, the second type second coefficient depends on second exposure time tM and exposure time tK2 of low-sensitivity pixel K2, and is a coefficient for scale aligning the pixel signal (K2 or P2) of interpolated low-sensitivity frame (K2) to pixel signal (M) of the second high-sensitivity frame. For example, the second type second coefficient is determined depending on exposure time tK2, second exposure time tM, the gain and sensitivity of high-sensitivity pixel PD, and the gain and sensitivity of low-sensitivity pixel K2.

Low-sensitivity signal generating circuit 742 generates second low-sensitivity frame (M) by synthesizing (i) interpolated low-sensitivity frame (K1) multiplied by the first type second coefficient and (ii) interpolated low-sensitivity frame (K2) multiplied by the second type second coefficient.

Low-sensitivity signal generating circuit 743 generates third low-sensitivity frame (S) for correcting third high-sensitivity frame (S) by synthesizing the pixel signal (K1 or P1) of interpolated low-sensitivity frame (K1) and the pixel signal (P2 or K2) of interpolated low-sensitivity frame (K2). To be specific, low-sensitivity signal generating circuit 743 multiplies the pixel signal (K1 or P1) of interpolated low-sensitivity frame (K1) by a first type third coefficient and the pixel signal (P2 or K2) of interpolated low-sensitivity frame (K2) by a second type third coefficient.

First type third coefficient here depends on third exposure time tS and exposure time tK1 of low-sensitivity pixel K1, and is a coefficient for scale aligning the pixel signal (K1 or P1) of interpolated low-sensitivity frame (K1) to pixel signal (S) of the third high-sensitivity frame. For example, the first type third coefficient is determined depending on exposure time tK1, third exposure time tS, the gain and sensitivity of high-sensitivity pixel PD, and the gain and sensitivity of low-sensitivity pixel K1. Similarly, the second type third coefficient depends on third exposure time tS and exposure time tK2 of low-sensitivity pixel K2, and is a coefficient for scale aligning the pixel signal (K2 or P2) of interpolated low-sensitivity frame (K2) to pixel signal (S) of the third high-sensitivity frame. For example, the second type third coefficient is determined depending on exposure time tK2, third exposure time tS, the gain and sensitivity of high-sensitivity pixel PD, and the gain and sensitivity of low-sensitivity pixel K2.

Low-sensitivity signal generating circuit 743 generates third low-sensitivity frame (S) by synthesizing (i) interpolated low-sensitivity frame (K1) multiplied by the first type third coefficient and (ii) interpolated low-sensitivity frame (K2) multiplied by the second type third coefficient.

Corrector 75 and WDR synthesis circuit 76 are the same as in FIG. 12A.

Figure 20:
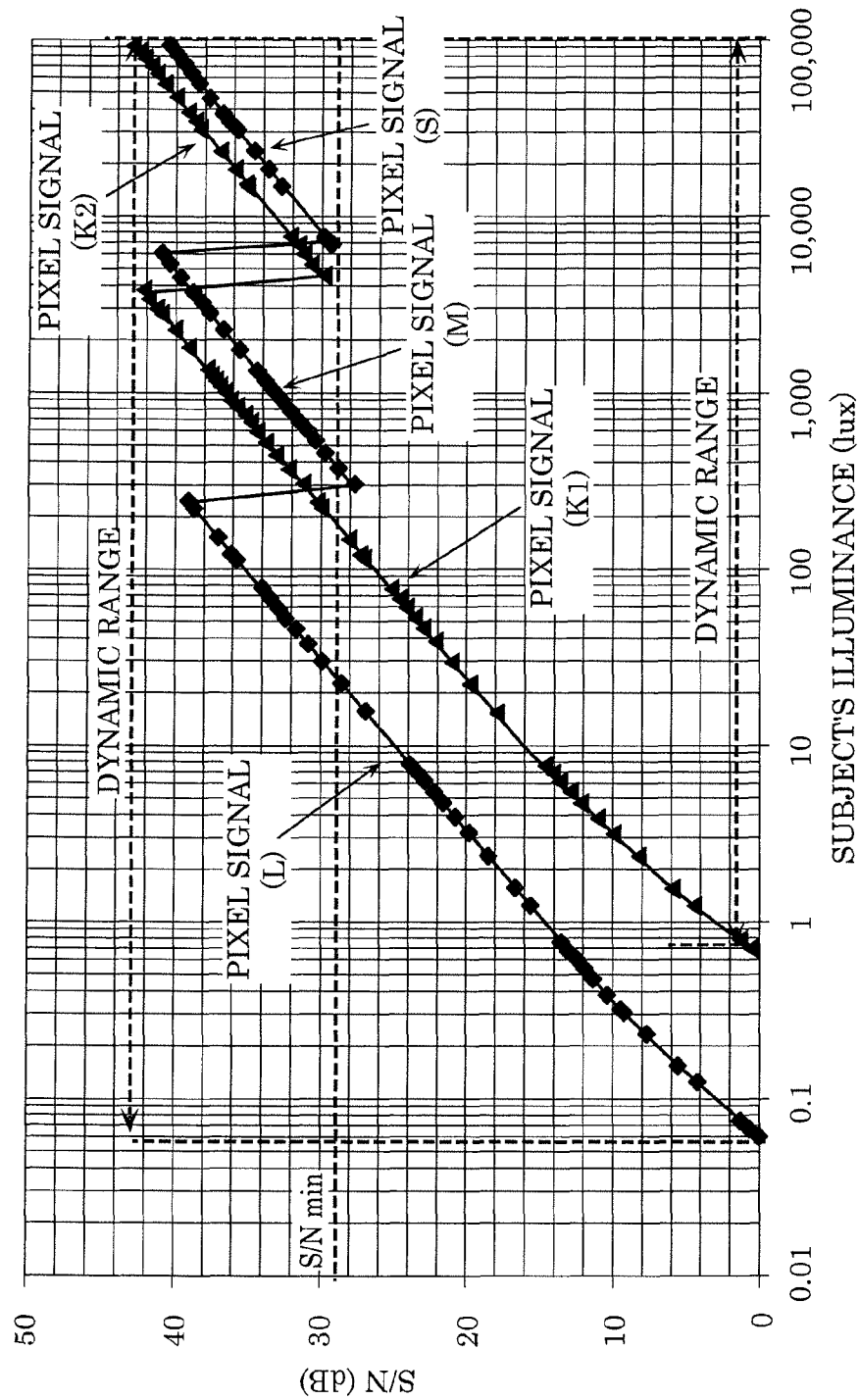
FIG. 20 is a diagram showing characteristics of the high-sensitivity pixels and the low-sensitivity pixels according to Embodiment 2 with respect to a subject's illuminance.
Figure 21:
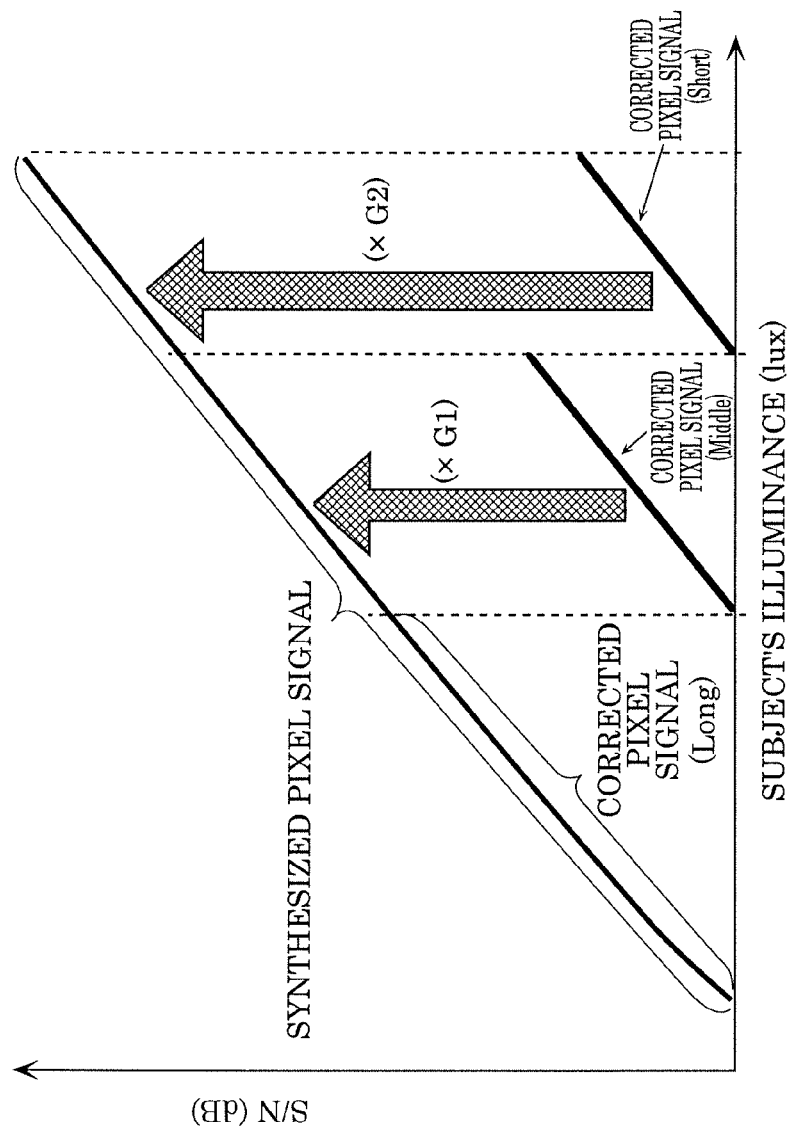
FIG. 21 is an explanatory diagram showing a WDR synthesis example in the signal processor in FIG. 19A according to Embodiment 2.

FIG. 20 is a diagram showing characteristics of the high-sensitivity pixels and the low-sensitivity pixels according to Embodiment 2 with respect to a subject's illuminance. FIG. 21 is an explanatory diagram showing a WDR synthesis example in signal processor 70 in FIG. 19A according to Embodiment 2. The dynamic range in FIGS. 20 and 21 is increased more effectively than in FIGS. 10 and 11 since pixel signal (K1) and pixel signal (K2) are used instead of pixel signal (K).

Note that the exposure times of low-sensitivity pixels K1 and K2 may be tK1>tL+tM+tS and tK2>tL+tM+tS. tK1 and tK2 may be between approximately 16.6 ms (=1/60 fps) of one vertical synchronization period and approximately 11 ms (=1/90 Hz) corresponding to a minimum frequency of LEDs.

The saturation-sensitivity ratio of low-sensitivity pixel K1 to low-sensitivity pixel K2 may, for example, be 1:20, and low-sensitivity pixels K1 and K2 may be configured as to not saturate even when receiving an object's maximum illuminance (illuminance of sunlight) of 100,000 lux.

A simplified calculation of the dynamic range (DR) of the high-sensitivity pixels is as follows.

$$DR \text{ of } WDR = DR \text{ of } 1 \text{ frame} + \text{ratio of maximum exposure to minimum exposure}$$
$$= 72 \text{ dB } (A/D \text{ 12-bit}) + 48 \text{ dB} \times (256/1)$$
$$= 120 \text{ dB}$$

Note that with regard to the dynamic range of one frame, the dynamic range (=saturation/noise ratio) of the pixels are limited by a precision of A/D bit width, assuming that the dynamic range of the pixels exceeds the precision of A/D bit width.

A simplified calculation of the dynamic range of low-sensitivity pixels K1 and K2 is similarly as follows.

$$DR \text{ of } WDR = DR \text{ of } 1 \text{ frame} + \text{ratio of saturation-sensitivity ratio of } K2 \text{ to saturation-sensitivity ratio } K1$$
$$= 72 \text{ dB}(A/D \text{ 12-bit}) + 26 \text{ dB} \times 20$$
$$= 98 \text{ dB} \approx 100 \text{ dB}$$

The dynamic range of low-sensitivity pixels K1 and K2 is configured to form a S/N curve from 100,000 lux.

The solid-state imaging apparatus according to the present embodiment adjusts control voltage ΦPG of control electrode PG so that the low-sensitivity pixels do not saturate and that the saturation level is not too low during the signal processing of the low-sensitivity pixels, and can also implement automatic exposure (AE) control and a white balance.

The solid-state imaging apparatus implements a gravity correction so that a gravity of each pixel does not shift during the interpolation by interpolation circuits 731 and 732.

This enables the low-sensitivity pixels to be in a correct exposure state.

Control electrode PG has a dark current problem due to the electric charge accumulating proximate to the surface, and there are, therefore, cases where image quality (S/N) is too low, especially for the image quality during low illuminance that emphasizes S/N.

In Embodiments 1 and 2, however, the S/N of the low-sensitivity pixels including control electrode PG does not deteriorate since the low-sensitivity pixels are used for the correction of the high-sensitivity pixel signal for the flicker reduction.

Note that an example has been described of low-sensitivity pixels K, K1, and K2 having control electrode PG with a photodiode structure as a means to adjust the saturation level, but as long as the saturation-sensitivity ratio can be adjusted at will by adjusting only the sensitivity, low-sensitivity pixels K, K1, and K2 may also not have a photodiode structure.

An example has been described of the high-sensitivity pixels generating three high-sensitivity frames (L, M, and S), but are not limited thereto.

An example has been described of the high-sensitivity pixels being disposed in a Bayer arrangement (R, Gr, B, and Gb), but are not limited thereto, and may also be disposed as (R, C, C, and B), (R, C, C, and C), or (R, G, B, and Ir).

In solid-state imaging apparatus 1 in the above-described Embodiment 2, the low-sensitivity pixels include first low-sensitivity pixels K1 and second low-sensitivity pixels K2. At least one of a signal saturation level and a sensitivity of first low-sensitivity pixels K1 is different from the at least one of a signal saturation level and a sensitivity of second low-sensitivity pixels K2.

Solid-state imaging apparatus 1 may includes first pixel groups G1 and second pixel groups G2. First pixel groups G1 may each include four high-sensitivity pixels disposed in a square region, and four first low-sensitivity pixels disposed in the square region. Second pixel groups G2 may each include four high-sensitivity pixels disposed in a square region, and four second low-sensitivity pixels disposed in the square region. First pixel groups G1 and second pixel groups G2 may be alternately disposed in rows and columns.

Signal processor 70 may generate (i) a first interpolated frame including first pixel signals obtained from the first low-sensitivity pixels, and first interpolated signals obtained through interpolation using the first pixel signals, (ii) a second interpolated frame including second pixel signals obtained from the second low-sensitivity pixels, and second interpolated signals obtained through interpolation using the second pixel signals, and (iii) the pixel signal by detecting a difference signal between the signal from the high-sensitivity pixels and a signal obtained by synthesizing the first interpolated frame and the second interpolated frame, and correcting the signal from the high-sensitivity pixels using the difference signal.

Solid-state imaging apparatus 1 may generate, within one vertical scanning period, a first high-sensitivity frame, a second high-sensitivity frame, and a third high-sensitivity frame by respectively performing a first exposure operation that exposes the high-sensitivity pixels for a first exposure time, a second exposure operation that exposes the high-sensitivity pixels for a second exposure time, and a third exposure operation that exposes the high-sensitivity pixels for a third exposure time. The first exposure time may be longer than the second exposure time and the second exposure time may be longer than the third exposure time. Signal processor 70 may generate (i) a second low-sensitivity frame and a third low-sensitivity frame by multiplying a frame including the signal from the low-sensitivity pixels by, respectively, a second coefficient corresponding to the second exposure time and a third coefficient corresponding to the third exposure time, (ii) a second correction signal by detecting a difference signal between a signal from the second high-sensitivity frame and a signal from the second low-sensitivity frame, and correcting the signal from the second high-sensitivity frame using the difference signal, (iii) a third correction signal by detecting a difference signal between a signal from the third high-sensitivity frame and a signal from the third low-sensitivity frame, and correcting the signal from the third high-sensitivity frame using the difference signal, and (iv) the pixel signal by synthesizing a signal from the first high-sensitivity frame, the second correction signal and the third correction signal.

Embodiment 3

Solid-state imaging apparatus 1 that can adjust the sensitivity of low-sensitivity pixel K by distributing the time during which the normal exposure and the intermediate exposure are repeated is described in Embodiment 3 as a variation of the solid-state imaging apparatus according to the above Embodiment 1. Note that hereinafter, differences with Embodiment 1 will mainly be described and overlapping descriptions are omitted.

Figure 22A:
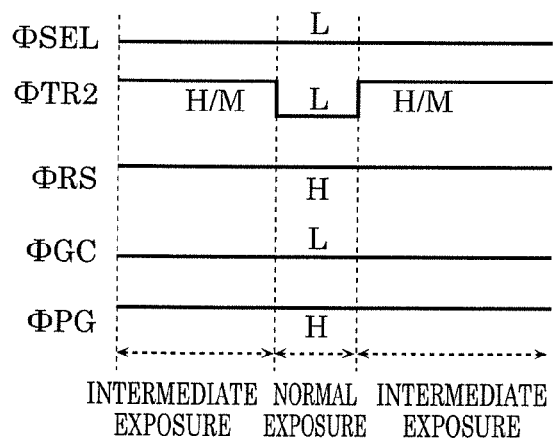
FIG. 22A is a timing diagram showing a normal exposure and an intermediate exposure according to Embodiment 3.
Figure 22B:
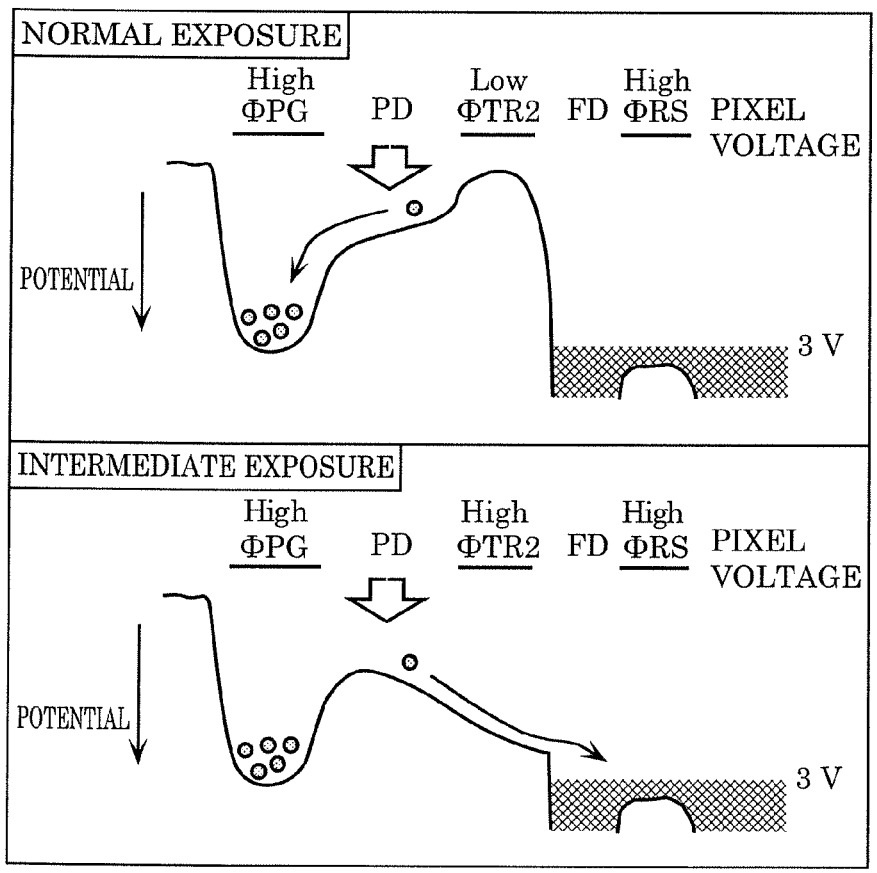
FIG. 22B is an explanatory diagram showing an operation example of the normal exposure and the intermediate exposure according to Embodiment 3.

FIG. 22A is a timing diagram showing a normal exposure and an intermediate exposure according to Embodiment 3. FIG. 22B is an explanatory diagram showing an operation example of the normal exposure and the intermediate exposure according to Embodiment 3.

As illustrated in FIGS. 22A and 22B, during the normal exposure, transfer voltage ΦTR=L (low level) and control voltage ΦPG of a photogate=H (high level), and respectively accumulate signal charge in the charge storage region proximate to the surface of low-sensitivity pixel K and the deep charge storage region. During the intermediate exposure, however, ΦTR=H or M (medium level) and ΦPG=H, and the electric charge continues being accumulated in the charge storage region proximate to the surface of low-sensitivity pixel K, but will not be accumulated in the deep charge storage region. This makes it possible to adjust the generated electric charge amount with respect to the sensitivity, i.e., amount of light received, of low-sensitivity pixel K by controlling the normal exposure and the intermediate exposure to repeatedly alternate (called multiple exposure).

In other words, the sensitivity of low-sensitivity pixel K is made variable by (i) adjusting control voltage ΦPG of the above photodiode and a pulse duty of transfer voltage ΦTR is adjusted, and (ii) and causing the normal exposure and the intermediate exposure (electric charge emitting) to repeat.

As illustrated in Embodiment 2, for example, when having low-sensitivity pixels K1 and K2, a magnitude relationship thereof is sensitivity of K1>sensitivity of K2 when normal exposure time of K1>normal exposure time of K2, and saturation-sensitivity ratio of K1<saturation-sensitivity ratio of K2 can be set.

This makes it possible to adjust the saturation level with the voltage level of ΦPG, and to adjust the sensitivity level with a distribution of the normal exposure time and the intermediate exposure time. This makes it possible to freely determine the dynamic range by freely configuring the saturation/sensitivity ratio.

The sensitivity of low-sensitivity pixel K during this multiple exposure can be expressed with the following formula.

sensitivity of multiple exposure=(sensitivity 1×normal exposure time+sensitivity 2×intermediate exposure time)/1V Sensitivity 1 is the sensitivity of the normal exposure per 1V. Sensitivity 2 is the sensitivity of the intermediate exposure per 1V.

The normal exposure and the intermediate exposure (electric charge emission) may be performed simultaneously for every row. This is because the layout of an address decoder of vertical scanning circuit 14 is more complicated when using the rolling shutter motion.

Figure 23A:
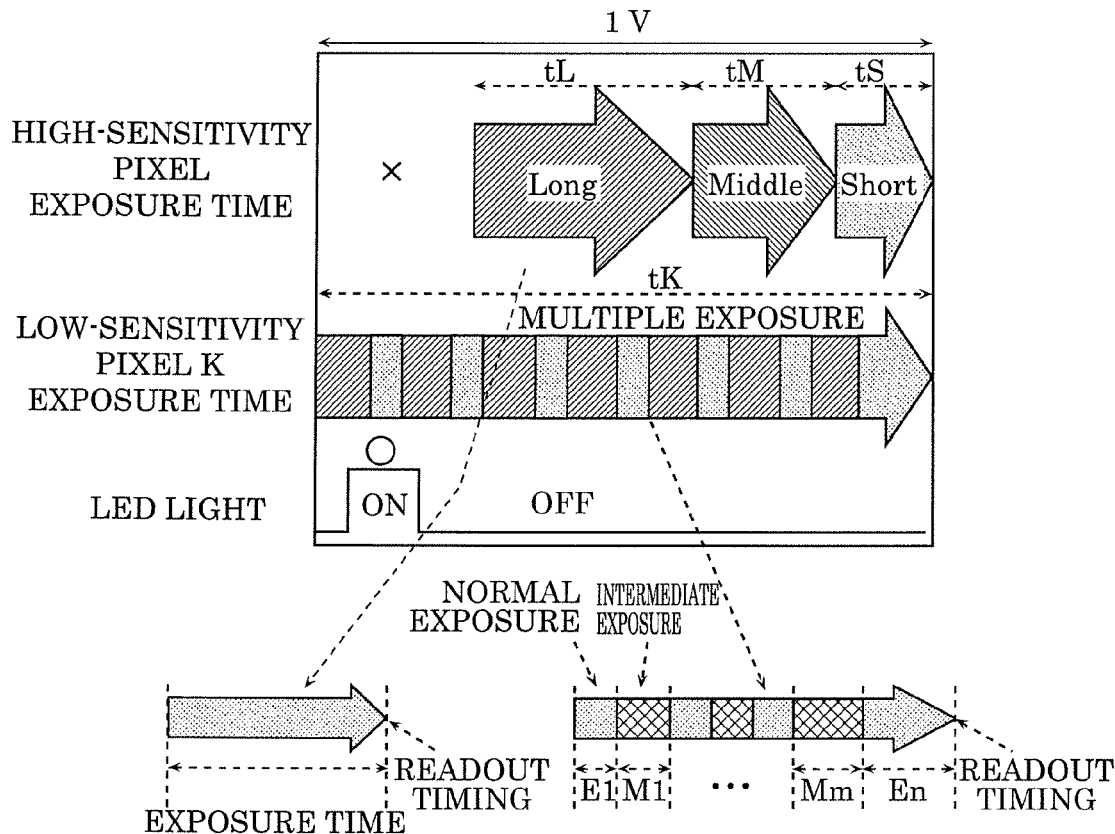
FIG. 23A is a diagram showing an example of an exposure operation of the high-sensitivity pixel and the low-sensitivity pixel according to Embodiment 3.
Figure 23B:
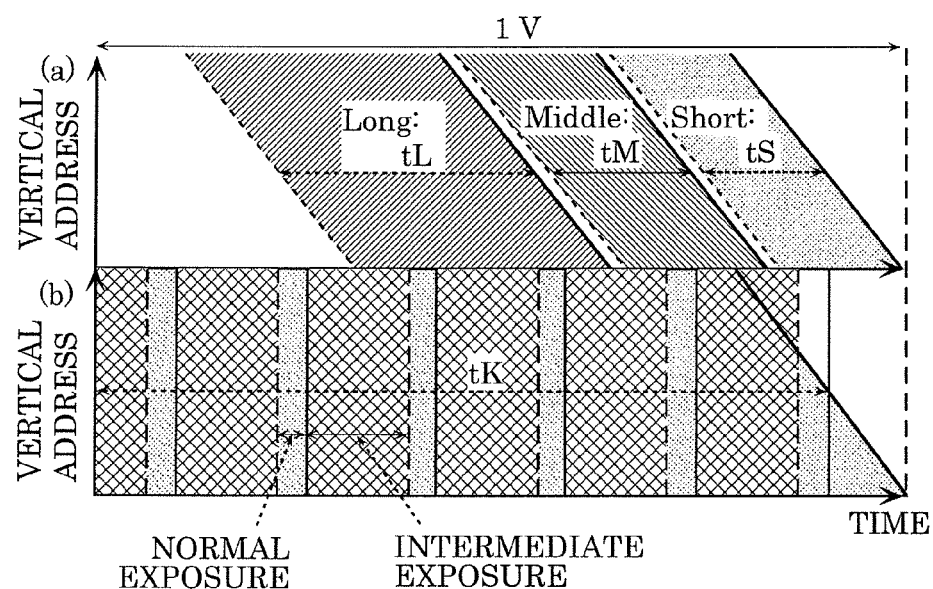
FIG. 23B is a diagram showing an example of an exposure operation and row scanning of the high-sensitivity pixel and the low-sensitivity pixel according to Embodiment 3.
Figure 24A:
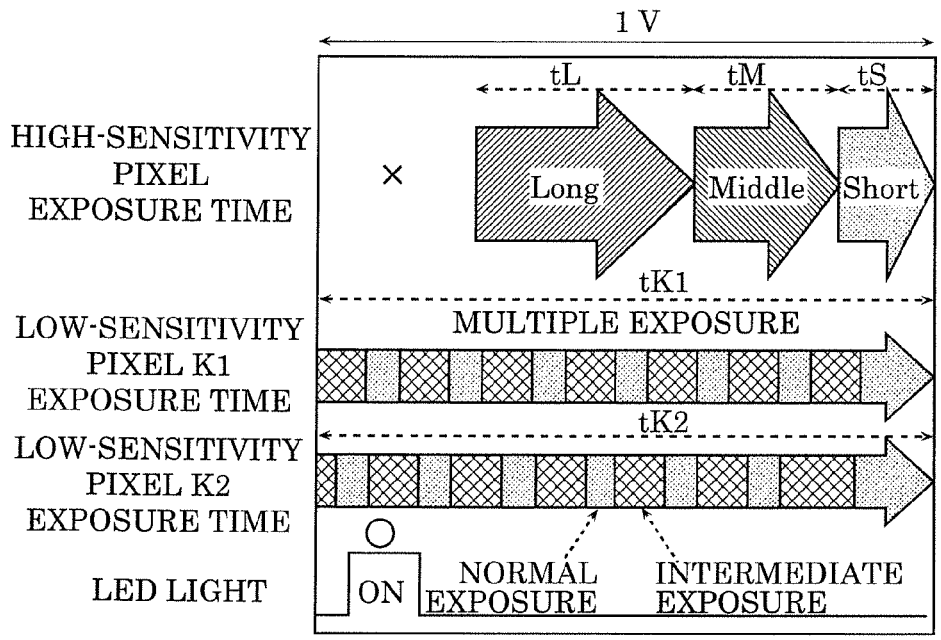
FIG. 24A is a diagram showing another example of an exposure operation of the high-sensitivity pixels and the low-sensitivity pixels according to Embodiment 3.
Figure 24B:
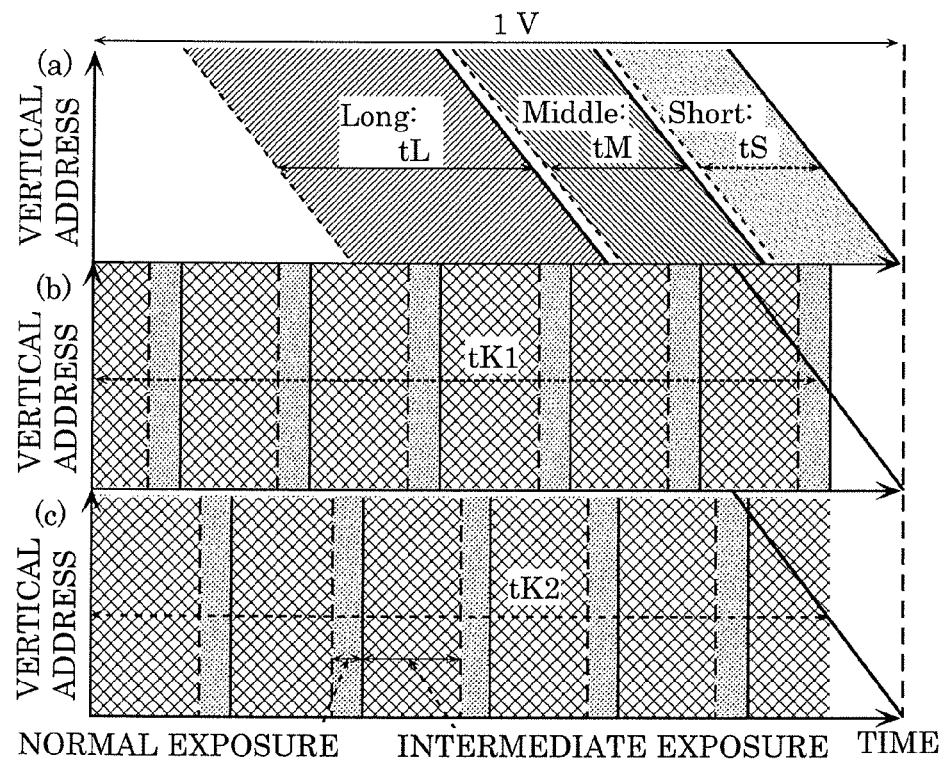
FIG. 24B is a diagram showing another example of an exposure operation and row scanning of the high-sensitivity pixels and the low-sensitivity pixels according to Embodiment 3.

FIG. 23A is a diagram showing an example of an exposure operation of the high-sensitivity pixel and the low-sensitivity pixel according to Embodiment 3. FIG. 23B is a diagram showing an example of an exposure operation and row scanning of high-sensitivity pixel and the low-sensitivity pixel according to Embodiment 3.

As illustrated in FIG. 23A, solid-state imaging apparatus 1 according to the present embodiment exposes the high-sensitivity pixels three times, exposure times tL, tM, and tS, which are split up with different durations, for increasing the dynamic range of the high-sensitivity pixels. Low-sensitivity pixel K is exposed multiple times for the longer exposure time tK in parallel with the high-sensitivity pixel. Multiple exposure is, for example, repeating the normal exposure and the intermediate exposure.

Note that in FIG. 23B, an output sequence of the high-sensitivity pixel and the low-sensitivity pixel are the rolling shutter motion in the row scanning, and the exposure times can be freely configured. The sensitivity of low-sensitivity pixel K can be configured in accordance with the above formula depending on a ratio of a total duration of normal exposure times E1 to En and a total duration of intermediate exposure times M1 to Mn.

This makes it possible to broadly adjust the sensitivity of low-sensitivity pixel K through the multiple exposure thereof with regard to the problem of the dynamic range.

With regard to the multiple exposure, a ratio of the exposure time of photodiode K of the low-sensitivity pixel to the intermediate exposure time can be adjusted. To give an example, one H exposure time and three H intermediate exposure times, one H exposure time and seven H intermediate exposure times, one H exposure time and 15 H intermediate exposure times, or one H exposure time and 31 H intermediate exposure times can be set. When the signal readout motion and the intermediate exposure motion are simultaneous, the signal readout motion has priority.

Solid-state imaging apparatus 1 in the above-described Embodiment 3 includes pixel circuits 3 arranged in a matrix. Pixel circuits 3 each include at least one high-sensitivity pixel; floating diffusion layer FD that retains signal charge; a first transfer transistor that is disposed corresponding to the at least one high-sensitivity pixel, and transfers signal charge of the at least one high-sensitivity pixel to floating diffusion layer FD; at least one low-sensitivity pixel; a second transfer transistor that is disposed corresponding to the at least one low-sensitivity pixel, and transfers signal charge of the at least one low-sensitivity pixel to the floating diffusion layer. Solid-state imaging apparatus 1 repeatedly performs a normal exposure operation and an intermediate exposure operation on the low-sensitivity pixels within one vertical scanning period; during the normal exposure operation, a gate electrode of the second transfer transistor is at a low level; during the intermediate exposure operation, the gate electrode of the second transfer transistor is at a high level or a medium level; and simultaneously switches all rows of the low-sensitivity pixels from the normal exposure operation to the intermediate exposure operation, and simultaneously switches all rows of the low-sensitivity pixels from the intermediate exposure operation to the normal exposure operation.

This makes it possible to broadly adjust the sensitivity of low-sensitivity pixel K through the multiple exposure thereof.

Embodiment 4

Hereinafter, an imaging apparatus according to Embodiment 4 will be described with reference to the drawings. Note that the imaging apparatus in the present embodiment includes at least one solid-state imaging apparatus 1 according to the above Embodiments 1 to 3. This will be described in detail hereinafter.

Figure 25A:
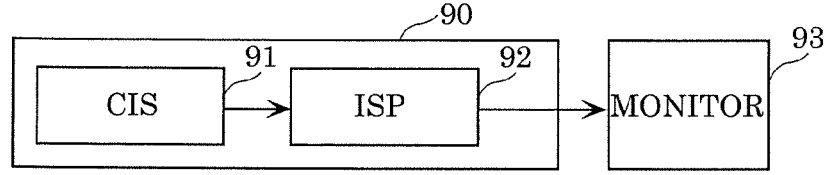
FIG. 25A is a block diagram showing a configuration example of the imaging apparatus according to Embodiment 4.

FIG. 25A is a block diagram showing a configuration example of the imaging apparatus according to Embodiment 4. The imaging apparatus in the drawing includes complementary metal-oxide-semiconductor (CMOS) image sensor (CIS) 91, image signal processor (ISP) 92, and monitor 93, and is, for example, a digital camera or a smartphone camera.

CIS 91 is solid-state imaging apparatus 1 shown in each of the embodiments.

ISP 92 receives a pixel signal from CIS 91 and performs image processing, e.g., enlargement, shrinking, compressing coding and the like.

Monitor 93 serves as confirmation for the user during capturing.

Note that CIS 91 and ISP 92 may be a single system on chip (SoC) 90, and may also be separate chips. When CIS 91 and ISP 92 are separate chips, signal processor 70 may be included in CIS 91 or in ISP 92.

A portion of signal processor 70 may be realized using software and not a circuit.

Figure 25B:
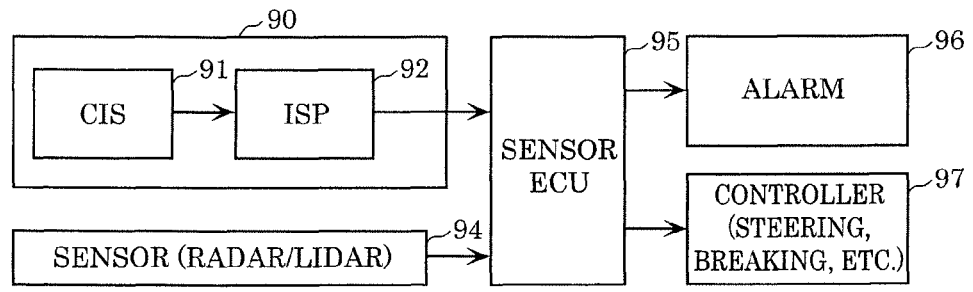
FIG. 25B is a block diagram showing another configuration example of the imaging apparatus according to Embodiment 4.

FIG. 25B is a block diagram showing another configuration example of the imaging apparatus according to Embodiment 4. The imaging apparatus in the drawing includes CIS 91, ISP 92, sensor 94, sensor electronic control unit (ECU) 95, alarm 96, and controller 97, and is, for example, a camera system installed in a vehicle.

CIS 91 and ISP 92 are the same as in FIG. 25A.

Sensor 94 is, for example, a radar sensor for ranging or a light detection and ranging (lidar) sensor for ranging.

Sensor ECU 95 receives a signal from ISP 92 and sensor 94 and controls alarm 96 and controller 97.

Alarm 96 is, for example, a variety of status display lights or warning lights inside an instrument panel of a vehicle.

Controller 97 controls, for example, an actuator and the like that drives steering, breaking, and the like of a vehicle.

Note that the imaging apparatus in FIG. 25B may correspond to a view system, an advanced driver-assistance sensing system, and an automated driving sensing system, may be connected to a monitor in the view system, and may implement a warning or control (steering, breaking, etc.) via a sensor ECU in the sensing system.

Figure 26A:
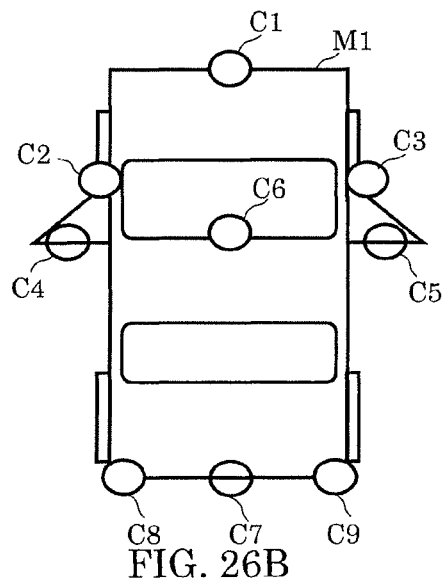
FIG. 26A is a diagram showing an installation example of the imaging apparatus in a vehicle according to Embodiment 4.
Figure 26B:
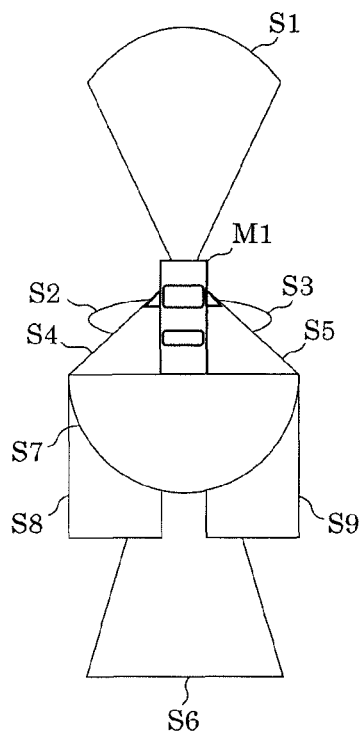
FIG. 26B is a diagram showing an example of a capture range in the installation example in FIG. 26A according to Embodiment 4.

FIG. 26A is a diagram showing an installation example of the imaging apparatus in vehicle M1 according to Embodiment 4. FIG. 26B is a diagram showing an example of a capture range in the installation example in FIG. 26A according to Embodiment 4.

In FIG. 26A, the imaging apparatus in FIG. 25A is, for example, attached to attachment locations C1 to C9. Attachment location C1 is a front portion of vehicle M1. Attachment location C2 is a left side portion of vehicle M1. Attachment location C3 is a right side portion of vehicle M1. Attachment location C4 is a left side door mirror. Attachment location C5 is a right side door mirror. Attachment location C6 is a rear-view mirror. Attachment location C7 is a rear-center portion of vehicle M1. Attachment location C8 is a rear-left side portion of vehicle M1. Attachment location C9 is a rear-right side portion of vehicle M1.

Capture ranges S1 to S9 shown in FIG. 26B correspond to capturing cameras at attachment locations C1 to C9.

As illustrated in FIGS. 26A and 26B, the imaging apparatus as viewing camera or sensing camera can be attached to a front, surrounding, side, rear, and intelligent rear of transportation machinery (vehicle, car) depending on the subject range of the capturing.

As described above, the imaging apparatus in Embodiment 4 includes the above solid-state imaging apparatus 1, and any one of a view system, an advanced driver-assistance sensing system, and an automated driving sensing system.

The imaging apparatus is installed on at least one of a front-view mirror, a left side mirror, a right side mirror, and a rear-view mirror of transportation machinery.

OTHER EMBODIMENTS

A solid-state imaging apparatus and an imaging apparatus using the solid-state imaging apparatus in the present disclosure has been described based on the above embodiments, but are not limited thereto. Forms realized by optionally combining components and functions in the embodiments, forms obtained by various combinations of the components in the different embodiments that can be conceived by a person skilled in the art which are within the scope of the essence of the present disclosure, and various devices built in the solid-state imaging apparatus and the imaging apparatus using the solid-state imaging apparatus in the present disclosure are also be included in the scope of the one or more aspects of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a solid-state imaging apparatus and an imaging apparatus.

What is claimed is:

1. A solid-state imaging apparatus, comprising:
a plurality of high-sensitivity pixels that are arranged in a matrix, and perform a photoelectric conversion at a predetermined sensitivity;

a plurality of low-sensitivity pixels that are arranged in a matrix in gaps between the plurality of high-sensitivity pixels, and perform a photoelectric conversion at a lower sensitivity than the predetermined sensitivity; and a signal processor that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal, wherein:

the solid-state imaging apparatus generates, within one vertical scanning period, a first high-sensitivity frame, a second high-sensitivity frame, and a third high-sensitivity frame by respectively performing a first exposure operation that exposes the plurality of high-sensitivity pixels for a first exposure time, a second exposure operation that exposes the plurality of high-sensitivity pixels for a second exposure time, and a third exposure operation that exposes the plurality of high-sensitivity pixels for a third exposure time, the first exposure time is longer than the second exposure time and the second exposure time is longer than the third exposure time, and the signal processor generates:

a first low-sensitivity frame, a second low-sensitivity frame and a third low-sensitivity frame by multiplying a frame including the signal from the plurality of low-sensitivity pixels by, respectively, a first coefficient corresponding to a first exposure time, a second coefficient corresponding to a second exposure time and a third coefficient corresponding to a third exposure time;

a first correction signal by detecting a difference signal between a signal from the first high-sensitivity frame and a signal from the first low-sensitivity frame, and correcting the signal from the first high-sensitivity frame using the difference signal;

a second correction signal by detecting a difference signal between a signal from the second high-sensitivity frame and a signal from the second low-sensitivity frame, and correcting the signal from the second high-sensitivity frame using the difference signal;

a third correction signal by detecting a difference signal between a signal from the third high-sensitivity frame and a signal from the third low-sensitivity frame, and correcting the signal from the third high-sensitivity frame using the difference signal; and the pixel signal by synthesizing the first correction signal, the second correction signal and the third correction signal.

2. The solid-state imaging apparatus according to claim 1, wherein the plurality of high-sensitivity pixels are exposed in parallel with the plurality of low-sensitivity pixels, and an exposure time of the plurality of low-sensitivity pixels is longer than an exposure time of the plurality of high-sensitivity pixels, shorter than one vertical synchronization period, and longer than a predetermined flicker cycle.

3. The solid-state imaging apparatus according to claim 1, wherein the signal processor adds the difference signal to the signal from the plurality of high-sensitivity pixels as the correcting of the signal from the plurality of high-sensitivity pixels.

4. The solid-state imaging apparatus according to claim 1, wherein the solid-state imaging apparatus generates, within one vertical scanning period, a plurality of high-sensitivity frames by performing an exposure operation a plurality of times, each having a different exposure time, on the plurality of high-sensitivity pixels, and the signal processor:

corrects a signal of each of the plurality of high-sensitivity frames using the signal from the plurality of low-sensitivity pixels; and synthesizes the plurality of high-sensitivity frames corrected.

5. The solid-state imaging apparatus according to claim 1, wherein the solid-state imaging apparatus generates, within one vertical scanning period, a first high-sensitivity frame, a second high-sensitivity frame, and a third high-sensitivity frame by respectively performing a first exposure operation that exposes the plurality of high-sensitivity pixels for a first exposure time, a second exposure operation that exposes the plurality of high-sensitivity pixels for a second exposure time, and a third exposure operation that exposes the plurality of high-sensitivity pixels for a third exposure time, the first exposure time is longer than the second exposure time and the second exposure time is longer than the third exposure time, and the signal processor generates:

a second low-sensitivity frame and a third low-sensitivity frame by multiplying a frame including the signal from the plurality of low-sensitivity pixels by, respectively, a second coefficient corresponding to the second exposure time and a third coefficient corresponding to the third exposure time;

a second correction signal by detecting a difference signal between a signal from the second high-sensitivity frame and a signal from the second low-sensitivity frame, and correcting the signal from the second high-sensitivity frame using the difference signal;

a third correction signal by detecting a difference signal between a signal from the third high-sensitivity frame and a signal from the third low-sensitivity frame, and correcting the signal from the third high-sensitivity frame using the difference signal; and the pixel signal by synthesizing a signal from the first high-sensitivity frame, the second correction signal and the third correction signal.

6. The solid-state imaging apparatus according to claim 1, wherein the plurality of low-sensitivity pixels include a plurality of first low-sensitivity pixels and a plurality of second low-sensitivity pixels, and at least one of a signal saturation level and a sensitivity of the plurality of first low-sensitivity pixels is different from the at least one of a signal saturation level and a sensitivity of the plurality of second low-sensitivity pixels.

7. The solid-state imaging apparatus according to claim 6, wherein the solid-state imaging apparatus includes a plurality of first pixel groups and a plurality of second pixel groups, the plurality of first pixel groups each include four of the plurality of high-sensitivity pixels disposed in a square region, and four of the plurality of first low-sensitivity pixels disposed in the square region, the plurality of second pixel groups each include four of the plurality of high-sensitivity pixels disposed in a square region, and four of the plurality of second low-sensitivity pixels disposed in the square region, and the plurality of first pixel groups and the plurality of second pixel groups are alternately disposed in rows and columns.

8. A solid-state imaging apparatus, comprising:

a plurality of high-sensitivity pixels that are arranged in a matrix, and perform a photoelectric conversion at a predetermined sensitivity;

a plurality of low-sensitivity pixels that are arranged in a matrix in gaps between the plurality of high-sensitivity pixels, and perform a photoelectric conversion at a lower sensitivity than the predetermined sensitivity; and a signal processor that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal, wherein:

the plurality of low-sensitivity pixels include a plurality of first low-sensitivity pixels and a plurality of second low-sensitivity pixels, at least one of a signal saturation level and a sensitivity of the plurality of first low-sensitivity pixels is different from the at least one of a signal saturation level and a sensitivity of the plurality of second low-sensitivity pixels, the solid-state imaging apparatus includes a plurality of first pixel groups and a plurality of second pixel groups, the plurality of first pixel groups each include four of the plurality of high-sensitivity pixels disposed in a square region, and four of the plurality of first low-sensitivity pixels disposed in the square region, the plurality of second pixel groups each include four of the plurality of high-sensitivity pixels disposed in a square region, and four of the plurality of second low-sensitivity pixels disposed in the square region, the plurality of first pixel groups and the plurality of second pixel groups are alternately disposed in rows and columns, and wherein:

the signal processor generates:

a first interpolated frame including a plurality of first pixel signals obtained from the plurality of first low-sensitivity pixels, and a plurality of first interpolated signals obtained through interpolation using the plurality of first pixel signals;

a second interpolated frame including a plurality of second pixel signals obtained from the plurality of second low-sensitivity pixels, and a plurality of second interpolated signals obtained through interpolation using the plurality of second pixel signals; and the pixel signal by (i) detecting a difference signal between the signal from the plurality of high-sensitivity pixels and a signal obtained by synthesizing the first interpolated frame and the second interpolated frame, and (ii) correcting the signal from the plurality of high-sensitivity pixels using the difference signal.

9. The solid-state imaging apparatus according to claim 8, wherein the solid-state imaging apparatus generates, within one vertical scanning period, a first high-sensitivity frame, a second high-sensitivity frame, and a third high-sensitivity frame by respectively performing a first exposure operation that exposes the plurality of high-sensitivity pixels for a first exposure time, a second exposure operation that exposes the plurality of high-sensitivity pixels for a second exposure time, and a third exposure operation that exposes the plurality of high-sensitivity pixels for a third exposure time, the first exposure time is longer than the second exposure time and the second exposure time is longer than the third exposure time, and the signal processor:

generates a first low-sensitivity frame, a second low-sensitivity frame, and a third low-sensitivity frame by synthesizing the first interpolated frame and the second interpolated frame, each using a first coefficient corresponding to a first exposure time, a second coefficient corresponding to a second exposure time, and a third coefficient corresponding to a third exposure time;

a first correction signal by detecting a difference signal between a signal from the first high-sensitivity frame and a signal from the first low-sensitivity frame, and correcting the signal from the first high-sensitivity frame using the difference signal;

a second correction signal by detecting a difference signal between a signal from the second high-sensitivity frame and a signal from the second low-sensitivity frame, and correcting the signal from the second high-sensitivity frame using the difference signal;

a third correction signal by detecting a difference signal between a signal from the third high-sensitivity frame and a signal from the third low-sensitivity frame, and correcting the signal from the third high-sensitivity frame using the difference signal; and the pixel signal by synthesizing the first correction signal, the second correction signal and the third correction signal.

10. The solid-state imaging apparatus according to claim 1, comprising:

a plurality of pixel circuits arranged in a matrix, wherein the plurality of pixel circuits each include:

at least one of the plurality of high-sensitivity pixels;

a floating diffusion layer that retains signal charge;

a first transfer transistor that is disposed corresponding to the at least one of the plurality of high-sensitivity pixels, and transfers signal charge of the at least one of the plurality of high-sensitivity pixels to the floating diffusion layer;

at least one of the plurality of low-sensitivity pixels;

a second transfer transistor that is disposed corresponding to the at least one of the plurality of low-sensitivity pixels, and transfers signal charge of the at least one of the plurality of low-sensitivity pixels to the floating diffusion layer; and a transistor that electrically disconnects or connects the second transfer transistor and the floating diffusion layer.

11. The solid-state imaging apparatus according to claim 1, further comprising:

a control electrode that is disposed at each of the plurality of low-sensitivity pixels, and covers a portion of the plurality of low-sensitivity pixels, wherein the control electrode controls a potential of a surface of each of the plurality of low-sensitivity pixels in accordance with a voltage applied to the control electrode.

12. A solid-state imaging apparatus comprising:
a plurality of high-sensitivity pixels that are arranged in a matrix, and perform a photoelectric conversion at a predetermined sensitivity;
a plurality of low-sensitivity pixels that are arranged in a matrix in gaps between the plurality of high-sensitivity pixels, and perform a photoelectric conversion at a lower sensitivity than the predetermined sensitivity;
a signal processor that generates a pixel signal by (i) detecting a difference signal between a signal from the plurality of high-sensitivity pixels and a signal from the plurality of low-sensitivity pixels, and (ii) correcting the signal from the plurality of high-sensitivity pixels using the difference signal; and
a plurality of pixel circuits arranged in a matrix,
wherein the plurality of pixel circuits each include:
at least one of the plurality of high-sensitivity pixels;
a floating diffusion layer that retains signal charge;
a first transfer transistor that is disposed corresponding to the at least one of the plurality of high-sensitivity pixels, and transfers signal charge of the at least one of the plurality of high-sensitivity pixels to the floating diffusion layer;
at least one of the plurality of low-sensitivity pixels; and
a second transfer transistor that is disposed corresponding to the at least one of the plurality of low-sensitivity pixels, and transfers signal charge of the at least one of the plurality of low-sensitivity pixels to the floating diffusion layer, and the solid-state imaging apparatus:
repeatedly performs a normal exposure operation and an intermediate exposure operation on the plurality of low-sensitivity pixels within one vertical scanning period;
during the normal exposure operation, a gate electrode of the second transfer transistor is at a low level;
during the intermediate exposure operation, the gate electrode of the second transfer transistor is at a high level or a medium level; and
simultaneously switches all rows of the plurality of low-sensitivity pixels from the normal exposure operation to the intermediate exposure operation, and simultaneously switches all rows of the plurality of low-sensitivity pixels from the intermediate exposure operation to the normal exposure operation.

13. An imaging apparatus, comprising:
the solid-state imaging apparatus according to claim 1; and
any one of a view system, an advanced driver-assistance sensing system, and an automated driving sensing system.

14. The imaging apparatus according to claim 13, wherein the imaging apparatus is installed on at least one of a front-view mirror, a left side mirror, a right side mirror, and a rear-view mirror of transportation machinery.

* * * * *